United States Patent
Kawahito

(10) Patent No.: US 8,610,615 B2
(45) Date of Patent: Dec. 17, 2013

(54) A/D CONVERSION INTEGRATED CIRCUIT

(75) Inventor: Shoji Kawahito, Hamamatsu (JP)

(73) Assignee: National University Corporation Shizuoka University (JP)

(*) Notice: Subject to any disclaimer, the term of this patent is extended or adjusted under 35 U.S.C. 154(b) by 23 days.

(21) Appl. No.: 13/322,375

(22) PCT Filed: May 27, 2010

(86) PCT No.: PCT/JP2010/059022
§ 371 (c)(1),
(2), (4) Date: Feb. 9, 2012

(87) PCT Pub. No.: WO2010/137660
PCT Pub. Date: Dec. 2, 2010

(65) Prior Publication Data
US 2012/0127004 A1    May 24, 2012

(30) Foreign Application Priority Data
May 27, 2009    (JP) .............................. P2009-128155

(51) Int. Cl.
*H03M 1/38*    (2006.01)

(52) U.S. Cl.
USPC .......................................... 341/161; 341/155

(58) Field of Classification Search
USPC .............................. 341/143, 144, 94, 118, 120
See application file for complete search history.

(56) References Cited

U.S. PATENT DOCUMENTS

| | | | |
|---|---|---|---|
| 5,760,722 A * | 6/1998 | Harris et al. ................... | 341/143 |
| 7,554,472 B2 * | 6/2009 | Puma ............................ | 341/143 |
| 7,671,773 B2 * | 3/2010 | Ceballos ....................... | 341/143 |
| 7,973,689 B2 * | 7/2011 | Glass et al. ................... | 341/143 |
| 8,164,500 B2 * | 4/2012 | Ahmed et al. ................. | 341/143 |

FOREIGN PATENT DOCUMENTS

| | | |
|---|---|---|
| EP | 2 056 461 | 5/2009 |
| JP | 2004-128637 | 4/2004 |
| JP | 2004-135321 | 4/2004 |
| JP | 2008-92134 | 4/2008 |

OTHER PUBLICATIONS

International Search Report issued Jun. 29, 2010 in connection with corresponding PCT Application No. PCT/JP2010/059022.

(Continued)

*Primary Examiner* — Brian Young
(74) *Attorney, Agent, or Firm* — Ostrolenk Faber LLP

(57) ABSTRACT

An A/D conversion integrated circuit including a plurality of A/D converters which can inhibit noises from being propagated by capacitive coupling from a conductor which transmits a digital signal is provided. In an A/D converter 13, an input 15 receives an analog signal to be A/D converted. An output 17 provides at least a part of a digital signal SD having a predetermined number of bits representing the analog signal SA. In response to an analog signal SA, a sub-A/D conversion circuit 19 generates a signal SDP representing one or a plurality of bit values of the digital signal SD and feeds the signal SDP to the output 17. An input 21a of a control circuit 21 is connected to an output 19a of the sub-A/D conversion circuit 19 and provides a control signal $S_{CONT}$ corresponding to the signal SDP. The control signal $S_{CONT}$ has a waveform including a transition from a voltage level L1 to a voltage level L2 and a transition from the voltage level L2 to the voltage level L1.

23 Claims, 14 Drawing Sheets

(56) References Cited

OTHER PUBLICATIONS

International Preliminary Report on Patentability issued on Dec. 22, 2011 in connection with corresponding International Application No. PCT/JP2010/059022.

Park, Jong-Ho et al. "A 0.1e– Vertical FPN 4.7e– Read Noise 71dB DR CMOS Image Sensor With 13b Column-Parallel Single-Ended Cyclic ADCs", IEEE International Solid-State Circuits Conference, pp. 268-269, 269a, Feb. 8, 2009.

Louis, Loai and Roberts, Gordon "A Single-path Multi-bit DAC for LP ΔΣ A/D Converters", Circuits and Systems, Proceedings of the 1998 IEEE International Symposium on Monterey, CA, IEEE, vol. 1, pp. 369-372, May 1998.

Buhmann A. et al. "Time-Continuous Delta-Sigma A/D Converters: From Theory to Practical Implementation", Communications, Advanced Signal Processing, Circuits, and System Design Techniques for, IEEE, PI, pp. 169-216, May 2006.

European Search Report for counterpart European Patent Application 10780614.3 dated Apr. 9, 2013.

* cited by examiner (a)

| sub ADC Code | D₁ | D₀ | B₁ | B₀ | φD2 | φD1 | φD0 |
|---|---|---|---|---|---|---|---|
| 2 | 1 | 1 | 1 | 1 | 1 | 0 | 0 |
| 1 | 0 | 1 | 0 | 1 | 0 | 1 | 0 |
| 0 | 0 | 0 | 0 | 0 | 0 | 0 | 1 |

Fig. 9

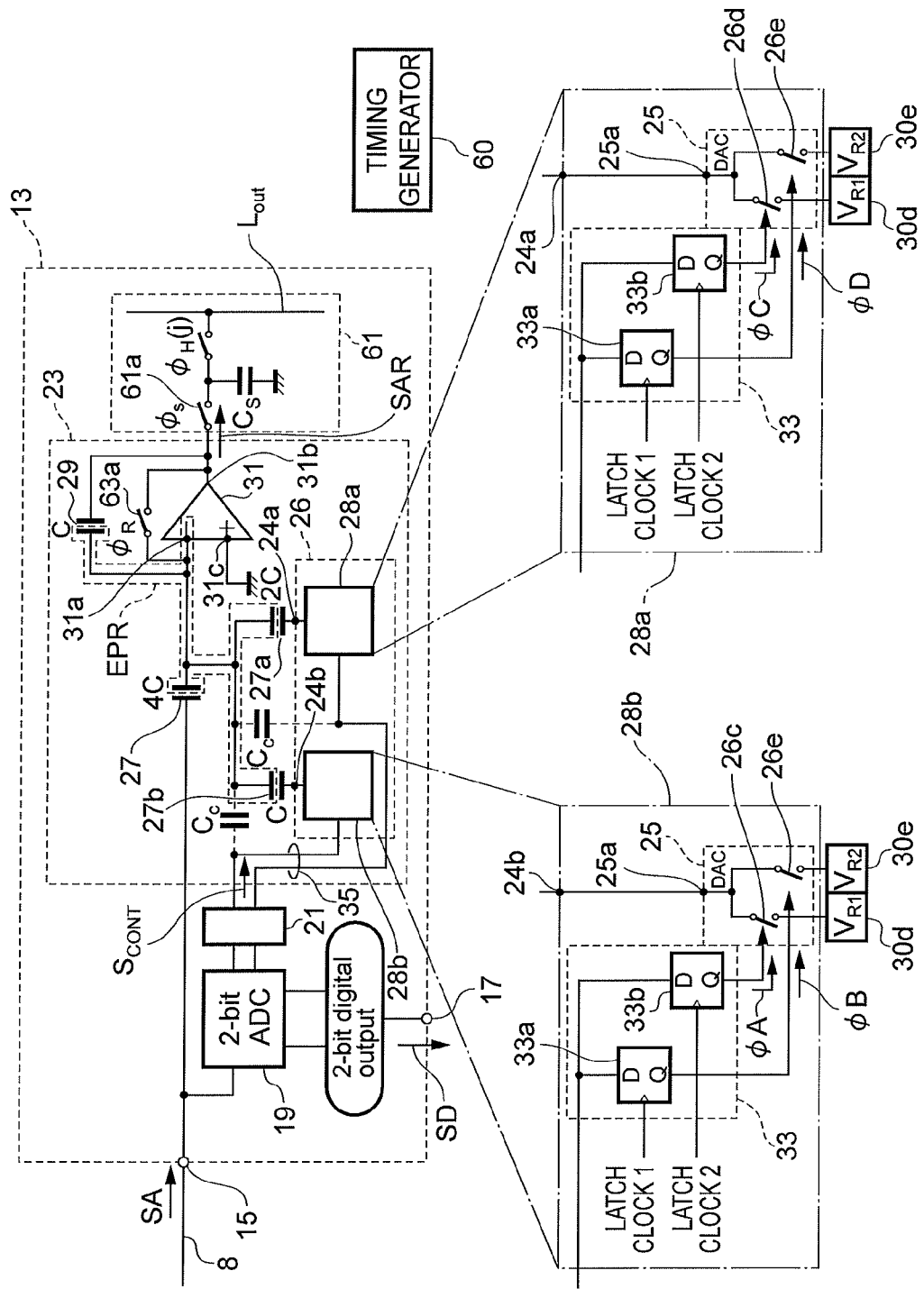

A/D CONVERSION INTEGRATED CIRCUIT

CROSS REFERENCE TO RELATED APPLICATIONS

The present application is a 35 U.S.C. §371 national phase conversion of PCT/JP2010/059022 filed May 27, 2010 and claims priority of P2009-128155 filed May 27, 2009, both incorporated herein in their entirety.

TECHNICAL FIELD

The present invention relates to an A/D conversion integrated circuit including a plurality of A/D converters.

BACKGROUND ART

Patent Literature 1 discloses a digital-to-analog conversion circuit which performs digital-to-analog conversion by using redundant digital-to-analog conversion devices. According to the background art of Patent Literature 1, the digital-to-analog conversion circuit is used in delta-sigma analog-to-digital converters. An RTZ or NRTZ waveform is employed as an output waveform of the digital-to-analog conversion circuit.

Patent Literature 2 discloses a D/A converter which converts an audio signal (1-bit digital signal) to an analog signal. According to the background art of Patent Literature 2, an RTZ waveform is employed as an output of the D/A converter.

CITATION LIST

Patent Literature

Patent Literature 1: Japanese Patent Application Laid-Open No. 2008-92134
Patent Literature 2: Japanese Patent Application Laid-Open No. 2004-128637

SUMMARY OF INVENTION

Technical Problem

In a circuit including analog and digital circuits performing signal processing by using a plurality of capacitors and an arithmetic amplifier circuit, an input of the arithmetic amplifier circuit may electrically be connected to another node of the analog circuit through the capacitors. At this time, a region of a conductor which is equipotential with the input of the arithmetic amplifier circuit, i.e., a conductor region including the input of the arithmetic amplifier circuit and one end of the capacitor connected to the input, has very high impedance when not connected in series to another node of the analog circuit. However, there is a possibility of capacitive coupling being formed between another conductor of the analog circuit and a conductor line through which the digital signal propagates, for example. For sufficiently lowering the coupling, it is preferred for the high-impedance conductor region to be physically separated from digital signal lines. In a circuit such as an A/D converter where digital and analog conductor lines coexist, it is often difficult to achieve separation with a physical distance. This becomes especially evident in uses where a number of A/D converters are arranged.

It is an object of the present invention to provide an A/D conversion integrated circuit including a plurality of A/D converters which can inhibit noises from being propagated by capacitive coupling from a conductor which transmits a digital signal.

Solution to Problem

One aspect of the present invention relates to an A/D conversion integrated circuit including a plurality of A/D converters arranged in a predetermined width. Each A/D converter in the A/D conversion integrated circuit comprises (a) an input for receiving an analog signal to be A/D converted; (b) an output for providing at least a part of a digital signal having a predetermined number of bits representing the analog signal; (c) a sub-A/D conversion circuit for generating a sub-digital signal representing one or a plurality of bit values in the digital signal in response to the analog signal and feeding the sub-digital signal to the output; (d) an RTZ waveform generator circuit, connected to an output of the sub-A/D conversion circuit, for generating an RTZ signal having modulated the sub-digital signal; (e) a D/A conversion circuit; (f) a switched-capacitor amplifier circuit comprising a plurality of capacitors, a switching device, and an arithmetic amplifier circuit, at least one of the capacitors being connected to a virtual grounding terminal of the arithmetic amplifier circuit through the switching device; and (g) an RTZ signal receiving circuit, including a memory circuit for holding a signal encoding the RTZ signal to a digital signal, for outputting the output of the memory circuit to the D/A conversion circuit.

In this A/D conversion integrated circuit, the D/A conversion circuit is controlled by a value immediately in front of the sub-A/D conversion circuit. For feeding a control signal therefor to the D/A conversion circuit in this A/D conversion integrated circuit, the RTZ waveform generator circuit modulates the sub-digital signal from the output of the A/D conversion circuit, so as to generate an RTZ signal, and outputs the RTZ signal to a signal line. The RTZ signal receiving circuit receives the RTZ signal from the signal line and converts the received signal to a digital signal, so as to generate a control signal for the D/A conversion circuit. On the other hand, the switched-capacitor circuit processes the analog signal to be A/D converted. The RTZ signal propagates through the signal line, which is coupled through a parasitic capacitor to a node within the switched-capacitor amplifier circuit. Therefore, at the time of processing, the node within the switched-capacitor amplifier circuit may be disturbed through the parasitic capacitor from the signal line. The number of transitions in the RTZ signal is zero or an even number. The node within the switched-capacitor amplifier circuit receiving a noise at the first transition of the RTZ signal also receives a noise at the second transition of the RTZ signal. The second noise to the node has substantially the same magnitude as that of the first one but in a direction opposite thereto. As a result, the two noises cancel each other out, thereby leaving a very low residual noise.

Preferably, in the A/D conversion integrated circuit in accordance with the present invention, the RTZ waveform generator circuit generates the RTZ signal constituted by a waveform including the same number of transitions from a first voltage level to a second voltage level and from the second voltage level to the first voltage level in a period when the switching device connected to the virtual grounding terminal of the arithmetic amplifier circuit keeps a state thereof unchanged. Preferably, in the A/D conversion integrated circuit in accordance with the present invention, the RTZ waveform generator circuit generates the RTZ signal constituted by a waveform including the same number of transitions from a first voltage level to a second voltage level and from the second voltage level to the first voltage level in a period when the virtual grounding terminal of the arithmetic amplifier circuit is in a virtual grounding state. Preferably, in the A/D conversion integrated circuit in accordance with the present invention, the RTZ waveform generator circuit in a cyclic A/D conversion operation constituted by a cyclic operation mode for returning the output of the sub-A/D conversion circuit to the D/A conversion circuit and an arithmetic processing mode for the arithmetic amplifier circuit to perform arithmetic processing generates the RTZ signal constituted by a waveform including the same number of transitions from a first voltage level to a second voltage level and from the second voltage level to the first voltage level at least during a period of the cyclic operation mode.

One aspect of the present invention relates to an A/D conversion integrated circuit including a plurality of A/D converters arranged in a predetermined width. Each A/D converter in the A/D conversion integrated circuit comprises (a) an input for receiving an analog signal to be A/D converted; (b) an output for providing at least a part of a digital signal having a predetermined number of bits representing the analog signal; (c) a sub-A/D conversion circuit for generating a signal representing one or a plurality of bit values in the digital signal in response to the analog signal and feeding thus generated signal to the output; (d) a control circuit, connected to an output of the sub-A/D conversion circuit, for providing a first control signal corresponding to the fed signal; and (e) a signal processing circuit having a D/A converter, a first capacitor, a second capacitor, and an arithmetic amplifier circuit. The D/A converter includes a memory circuit for latching the first control signal from the control circuit and a D/A conversion circuit having an output for providing an analog output value corresponding to a value stored in the memory circuit; the signal processing circuit performs at least one of signal processing and signal holding; the signal processing connects the first capacitor between the output of the D/A conversion circuit and an input of the arithmetic amplifier circuit while connecting the second capacitor between an output of the arithmetic amplifier circuit and the input of the arithmetic amplifier circuit; the signal holding separates the first capacitor from the input of the arithmetic amplifier circuit while connecting the second capacitor between the output of the arithmetic amplifier circuit and the input of the arithmetic amplifier circuit; and the first control signal has a waveform including the same number of transitions from a first voltage level to a second voltage level and from the second voltage level to the first voltage level.

One aspect of the present invention relates to an A/D conversion integrated circuit including a plurality of A/D converters arranged in a predetermined width. Each A/D converter in the A/D conversion integrated circuit comprises (a) an input for receiving an analog signal to be A/D converted; (b) an output for providing at least a part of a digital signal having a predetermined number of bits representing the analog signal; (c) a sub-A/D conversion circuit for generating a signal representing one or a plurality of bit values in the digital signal in response to the analog signal and feeding thus generated signal to the output; (d) a control circuit, connected to an output of the sub-A/D conversion circuit, for providing a first control signal corresponding to the fed signal; and (e) a signal processing circuit having a D/A converter, a first capacitor, a second capacitor, and an arithmetic amplifier circuit. The D/A converter includes a memory circuit for latching the first control signal from the control circuit and a D/A conversion circuit having an output for providing an analog output value corresponding to a value stored in the memory circuit; the signal processing circuit performs signal processing while connecting the first capacitor between the output of the D/A conversion circuit and an input of the arithmetic amplifier circuit and the second capacitor between an output of the arithmetic amplifier circuit and the input of the arithmetic amplifier circuit; and the first control signal has a waveform including the same number of transitions from a first voltage level to a second voltage level and from the second voltage level to the first voltage level in a period when the input of the arithmetic amplifier circuit connected to the first and second capacitors is in a high impedance state in terms of both direct and alternating currents.

In the signal processing in the signal processing circuit in this A/D conversion integrated circuit, the first capacitor is connected between the output of the D/A conversion circuit and the input of the arithmetic amplifier circuit, and the second capacitor is connected between the output and input of the arithmetic amplifier circuit. Therefore, the input of the arithmetic amplifier circuit is connected to another node of the signal processing circuit through the first and second capacitors. Hence, a conductor part which is equipotential with the first input of the arithmetic amplifier circuit becomes a node exhibiting high impedance.

The operation of the D/A converter is controlled by the control circuit. For this purpose, the control circuit feeds the first control signal to the D/A converter. The first control signal has a waveform including a transition from the first voltage level to the second voltage level and a transition from the second voltage level to the first voltage level. Therefore, the noises applied to a node by the first control signal are based on two transitions directed opposite to each other. Hence, when the node receiving noises has high impedance, the noises based on the two transitions directed opposite to each other resultantly cancel each other out.

The D/A conversion circuit includes the memory circuit for latching the first control signal and the output for providing an output value corresponding to the stored value of the memory circuit and thus can be operated by the control signal having a waveform including the same number of transitions from the first voltage level to the second voltage level and from the second voltage level to the first voltage level in a period when the input of the arithmetic amplifier circuit connected to the first and second capacitors is in a high impedance state in terms of both direct and alternating currents.

In the A/D conversion integrated circuit in accordance with the present invention, the first control signal propagates through a conductor connecting the memory circuit of the D/A converter and the control circuit, while the conductor is capacitively coupled through a parasitic capacitor to a conductor region connected to the first input of the arithmetic amplifier circuit during the signal processing.

When a node receiving noises has high impedance in this A/D conversion integrated circuit, the noises based on two transitions directed opposite to each other resultantly cancel each other out regardless of the magnitude of capacitive coupling to this node through the parasitic capacitor.

In the A/D conversion integrated circuit in accordance with the present invention, the control circuit provides a second control signal corresponding to the fed signal, the memory circuit latches the second control signal, the second control signal has a waveform including a transition from a third voltage level to a fourth voltage level and a transition from the fourth voltage level to the third voltage level, and a duration of the second voltage level in the waveform of the first control signal differs from a duration of the fourth voltage level in the waveform of the second control signal.

By using the second control signal in addition to the first control signal, this A/D conversion integrated circuit can perform binary or higher D/A conversion.

In the A/D conversion integrated circuit in accordance with the present invention, the control circuit provides a third control signal corresponding to the fed signal, the memory circuit latches the third control signal, the third control signal has a waveform including a transition from a fifth voltage level to a sixth voltage level and a transition from the sixth voltage level to the fifth voltage level, and an interval of the transitions in the waveform of the third control signal differs from an interval of the transitions in the waveform of the first control signal.

By using the second control signal in addition to the first control signal, this A/D conversion integrated circuit can perform ternary or higher D/A conversion.

In the A/D conversion integrated circuit in accordance with the present invention, the control circuit provides a fourth control signal corresponding to the fed signal, the memory circuit latches the third control signal, and the fourth control signal has a waveform with a fixed voltage level.

This A/D conversion integrated circuit can use, as a control signal, one having a fixed value.

In the A/D conversion integrated circuit in accordance with the present invention, the memory circuit may include a first latch circuit adapted to operate according to a first latch signal and a second latch circuit adapted to operate according to a second latch signal, while the first latch signal has a latch timing different from that of the second latch signal.

When fetching values of a plurality of control signals through the respective latch circuits, this A/D conversion integrated circuit can determine differences in voltage levels by using the latch signals having different timings from the respective initial transitions of the control signals.

The A/D conversion integrated circuit in accordance with the present invention may further comprise a feedback path for feeding back an arithmetic value generated by the signal processing through the output of the signal processing circuit to the input of the signal processing circuit. The A/D converter performs cyclic A/D conversion.

In this A/D conversion integrated circuit, the sub-A/D conversion circuit is placed near the output of the A/D converter. The conductor line for the control signal extends from the output side of the A/D converter to the input side thereof.

In the A/D conversion integrated circuit in accordance with the present invention, the signal processing circuit includes an input for receiving the analog signal and a third capacitor, while the third capacitor is connected between the input of the signal processing circuit and the first input of the arithmetic amplifier circuit in the signal processing.

In this A/D conversion integrated circuit, the sub-A/D conversion circuit is placed near the input of the A/D converter. The conductor line for the control signal extends from the input side of the A/D converter to the output side thereof.

In the A/D conversion integrated circuit in accordance with the present invention, the signal processing circuit includes an additional memory circuit for latching a fifth control signal from the control circuit and an additional D/A conversion circuit having an output for providing an output value corresponding to a value stored in the additional memory circuit, while the fifth control signal has a waveform including a transition from a seventh voltage level to an eighth voltage level and a transition from the seventh voltage level to the eighth voltage level.

This A/D conversion integrated circuit can provide four or more D/A-converted values by using two or more D/A conversion circuits, thereby reducing digital noises caused by control signals for controlling these D/A conversion circuits.

The A/D conversion integrated circuit in accordance with the present invention may further comprise a sensor array of a sensor circuit including a sensor device. The A/D converter is arranged in a column of the sensor array, while the analog signal is provided by the sensor array.

This A/D conversion integrated circuit can convert the analog signal from the sensor array into a digital value by using the A/D converter. A plurality of A/D converters may be arranged in a predetermined width, while the predetermined width may correspond to the length of a side of the sensor array.

The above-mentioned object and other objects, characteristic features, and advantages of the present invention will more easily be seen from the following detailed description set forth with reference to the accompanying drawings.

Advantageous Effects of Invention

As explained in the foregoing, the present invention can provide an A/D conversion integrated circuit including a plurality of A/D converters which can inhibit noises from being propagated by capacitive coupling from a conductor which transmits a digital signal.

BRIEF DESCRIPTION OF DRAWINGS

FIG. 6 is a chart illustrating a list of correspondences among output values (0, 1, 2), digital signals ($D_0$, $D_1$), latch signals ($B_0$, $B_1$), and control signals $\phi_{D0}$, $\phi_{D1}$, $\phi_{D2}$ of a sub-A/D conversion circuit;

FIG. 9 is a diagram schematically illustrating the structure of a cyclic A/D converter;

FIG. 14 is a diagram schematically illustrating the structure of another A/D converter.

DESCRIPTION OF EMBODIMENTS

The findings of the present invention will easily be understood in view of the following detailed descriptions with reference to the accompanying drawings given by way of illustration. In the following, embodiments of the A/D conversion integrated circuit in accordance with the present invention will be explained with reference to the accompanying drawings. The same parts will be referred to with the same signs when possible.

Figure 1:
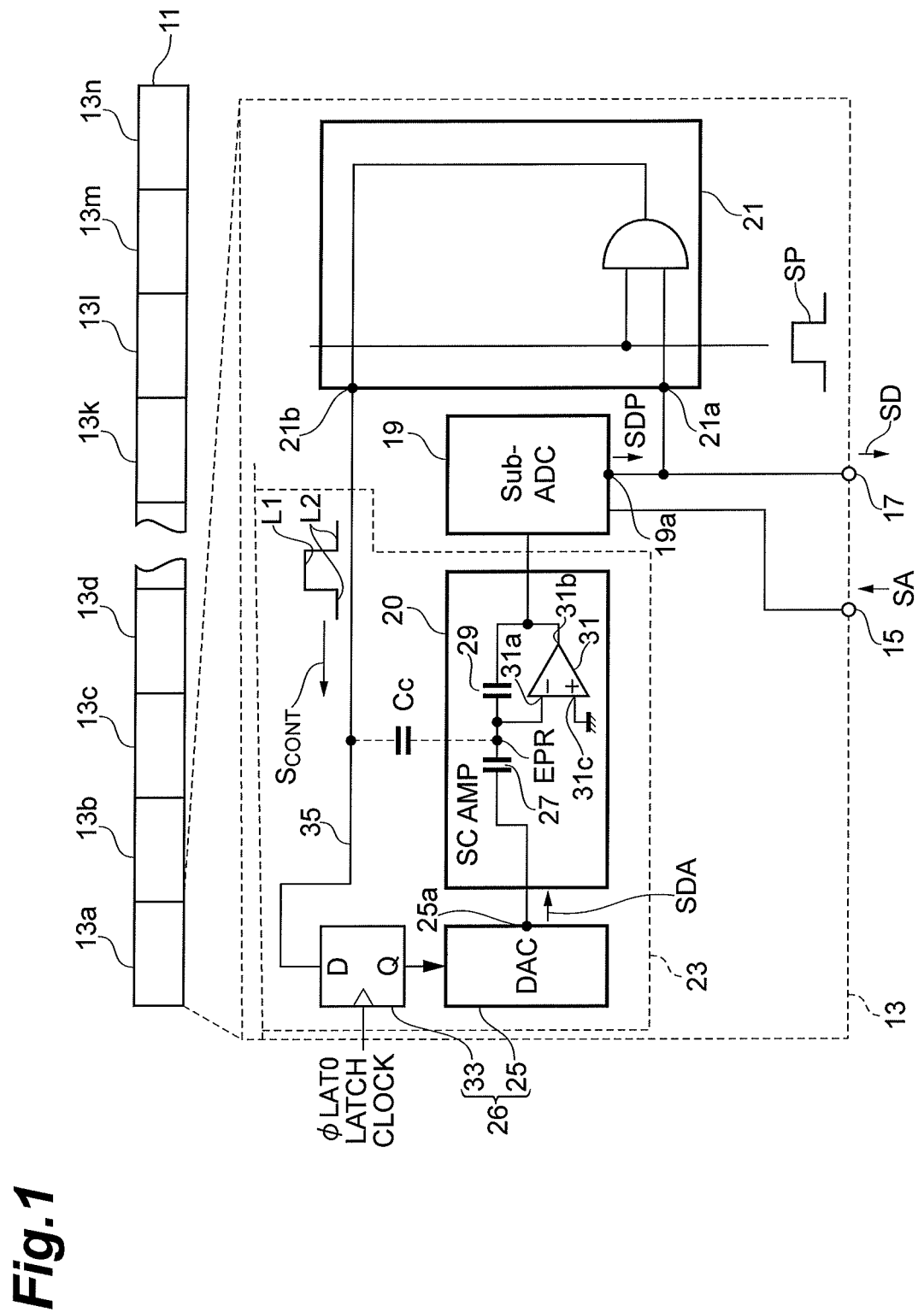
FIG. 1 is a diagram schematically illustrating the A/D conversion integrated circuit in accordance with an embodiment.

FIG. 1 is a diagram schematically illustrating the A/D conversion integrated circuit in accordance with an embodiment. This A/D conversion integrated circuit 11 includes a plurality of A/D converters 13a to 13n. The A/D converters 13a to 13n may be arranged in a predetermined width. The structure of an A/D converter (referred to with "13") is illustrated for the representative A/D converter 13a. The A/D converter 13 comprises an input 15, an output 17, a sub-A/D conversion circuit 19, a control circuit 21, and a signal processing circuit 23. The input 15 receives an analog signal SA to be A/D converted. The output 17 provides at least a part (e.g., sub-digital signal) of a digital signal SD having a predetermined number of bits representing the analog signal SA. The sub-A/D conversion circuit 19 generates a signal SDP representing one or a plurality of bit values in the digital signal SD in response to the analog signal SA and feeds the signal SDP to the output 17. An input 21a of the control circuit 21 is connected to an output 19a of the sub-A/D conversion circuit 19 and provides a first control signal $S_{CONT}$ corresponding to the signal SDP. The first control signal $S_{CONT}$ has a waveform including a transition from a first voltage level L1 to a second voltage level L2 and a transition from the second voltage level L2 to the first voltage level L1. This waveform is generated by an AND gate receiving the signal SDP and a pulse signal SP, for example. In this example, the pulse width of the control signal $S_{CONT}$ is defined by the signal SP. Without being restricted to this example, the control signal $S_{CONT}$ can also be generated by a multiplexer, which can receive signals SP with a plurality of pulse widths, thereby defining the pulse width of the control signal $S_{CONT}$ having the value of the signal SDP.

In the signal processing circuit 23, a D/A conversion circuit 25 and a memory circuit 33 constitute a D/A converter 26. The D/A converter 26 is connected to an output 21b of the control circuit 21. The signal processing circuit 23 has a first capacitor 27, a second capacitor 29, and an arithmetic amplifier circuit 31. The D/A converter 26 includes the memory circuit 33 and the D/A conversion circuit 25. The memory circuit 33 latches the first control signal $S_{CONT}$ from the control circuit 25 in response to a signal $\phi_{LATO}$. The D/A conversion circuit 25 provides an analog output value SDA corresponding to the stored value of the memory circuit 33. By connecting the first capacitor 27 between an input of a switched-capacitor amplifier circuit 20 and a first input (e.g., inverting input) 31a of the arithmetic amplifier circuit 31 and the second capacitor 29 between an output (e.g., non-inverting output) 31b of the arithmetic amplifier circuit 31 and the first input (e.g., inverting input) 31a thereof, the signal processing circuit 23 performs signal processing. The connection among the first and second capacitors 27, 29 and the arithmetic amplifier circuit 31 constitutes an SC amplifier. In the connection, the input 31 is a virtual ground and can be referred to as a virtual grounding terminal. In this SC amplifier, a second input (e.g., non-inverting input) 31c of the arithmetic amplifier circuit 31 is connected to a grounding line. As a result of the signal processing, an arithmetic value is generated at the output (e.g., non-inverting output) 31b of the arithmetic amplifier circuit 31. This arithmetic value is fed to the output of the signal processing circuit 23. By connecting the second capacitor 29 between the output 31b and first input (e.g., inverting input) 31a of the arithmetic amplifier circuit 31 and separating the first capacitor 27 from the arithmetic amplifier circuit 31, the signal processing circuit 23 performs signal holding processing for holding the voltage in the second capacitor 29. Thus, in the operation mode in which at least one of the capacitors 27, 29 is connected to an input (e.g., input 31a) of the arithmetic amplifier circuit 31, the impedance of a node (conductor region) connected to the input 31a of the arithmetic amplifier circuit 31 is not sufficiently low in the A/D converter 13. Hence, the A/D converter 13 is sensitive to noises. Since the signal processing circuit 23 performs processing of analog signals, noises to the above-mentioned node hinder the accuracy in A/D conversion from improving.

As already explained, when the A/D converters 13a to 13n are arranged, one A/D converter is flanked by two other A/D converters, so that the A/D converters are arranged densely. Therefore, each of the A/D converters 13a to 13n is laid out with a small size (width). Elements constituting the A/D converter are arranged and wired with a high density. The first input 31a of the arithmetic amplifier circuit 31, one end of the first capacitor 27, and one end of the second capacitor 29 are connected together, so as to construct a conductive region EPR. In another example, in the SC amplifier, the second capacitor 29 may be connected between the output 31b and first input 31a of the arithmetic amplifier circuit 31, while the first capacitor 27 is separated from the arithmetic amplifier circuit 31, so as to form the conductive region EPR. During the signal processing, the conductive region EPR is equipotential. The first control signal $S_{CONT}$ propagates through a conductor 35 connecting the memory circuit 33 of the D/A converter 26 and the control circuit 21. In the restricted layout mentioned above, the conductor 35 passes near the conductor region EPR.

In the A/D conversion integrated circuit 11, the connection constituting the SC amplifier is used for the signal processing in the signal processing circuit 23. Therefore, the first input 31a of the arithmetic amplifier circuit 31 is coupled through a parasitic capacitor to another conductor (e.g., conductor 35) connected to the signal processing circuit 23. Hence, the conductor region EPR equipotential with the first input 31a of the arithmetic amplifier circuit 31 exhibits high impedance.

The operation of the D/A conversion circuit 25 is controlled by the control circuit 21. For this purpose, the control circuit 21 feeds the first control signal $S_{CONT}$ to the D/A conversion circuit 25. Since the waveform of the first control signal $S_{CONT}$ includes two transitions between the first and second voltage levels L1, L2, the noises applied from the first control signal $S_{CONT}$ to another conductor (e.g., conductor EPR) are based on the two transitions directed opposite to each other. Therefore, when the other conductor (e.g., conductor EPR) receiving the noises has high impedance, the noises based on the two transitions directed opposite to each other (or the same number (0 or greater) of transitions directed opposite to each other) resultantly cancel each other out. The first control signal $S_{CONT}$ has a waveform including the same number of transitions from the first voltage level L1 to the second voltage level L2 and from the second voltage level L2 to the first voltage level L1 in a period when the input of the arithmetic amplifier circuit 31 connected to the first and second capacitors 27, 29 is in a high impedance state in terms of both direct and alternating currents, for example.

The D/A converter 26 includes the memory circuit 33 for latching the first control signal $S_{CONT}$, while an output 25a of the D/A conversion circuit 25 provides an output value corresponding to the stored value of the memory circuit 33, whereby the D/A conversion circuit 25 is operable by the control signal $S_{CONT}$ with a waveform having two transitions.

In the A/D conversion integrated circuit 11, the first control signal $S_{CONT}$ propagates through the conductor 35, which is capacitively coupled through a parasitic capacitor $C_C$ to the conductor region EPR connected to the first input 31a of the arithmetic amplifier circuit 31 during the signal processing. However, regardless of the magnitude of the capacitive coupling through the parasitic capacitor $C_C$ (whose specific size is hard to estimate in the actual circuit), the noises based on the two transitions directed opposite to each other resultantly cancel each other out in the A/D conversion integrated circuit 11 when the node receiving the noises has high impedance.

Figure 2:
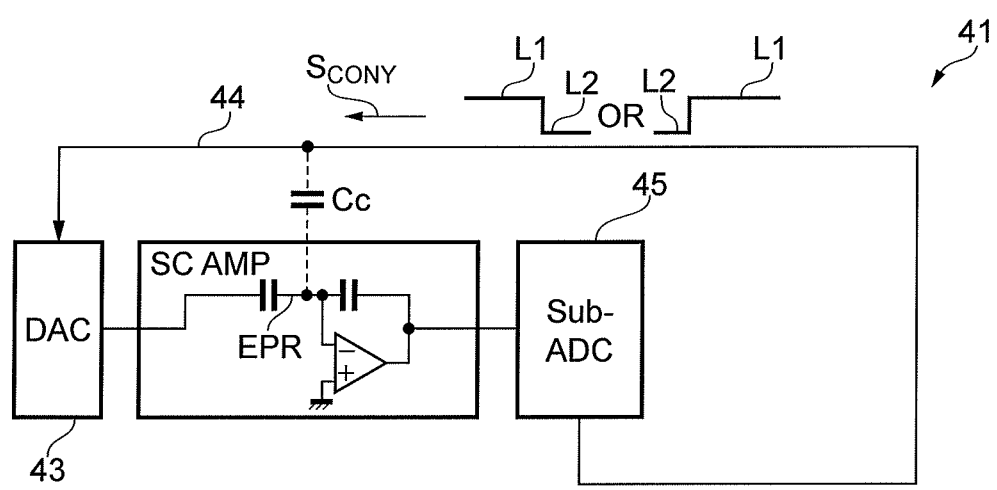
FIG. 2 is a diagram schematically illustrating the structure of an A/D converter different from those in FIG. 1.

FIG. 2 is a diagram schematically illustrating the structure of an A/D converter different from the A/D converter 13. In this A/D converter 41, a signal $V_{CONV}$ for controlling a D/A conversion circuit 43 is provided through a conductor 44 from a sub-A/D conversion circuit 45. This signal $V_{CONV}$ has a single transition from the first voltage level L1 to the second voltage level L2 or a single transition from the second voltage level L2 to the first voltage level L1. Within the SC amplifier, noises based on the single transition do not cancel each other out when the conductor EPR receiving the noises has high impedance.

Figure 3:
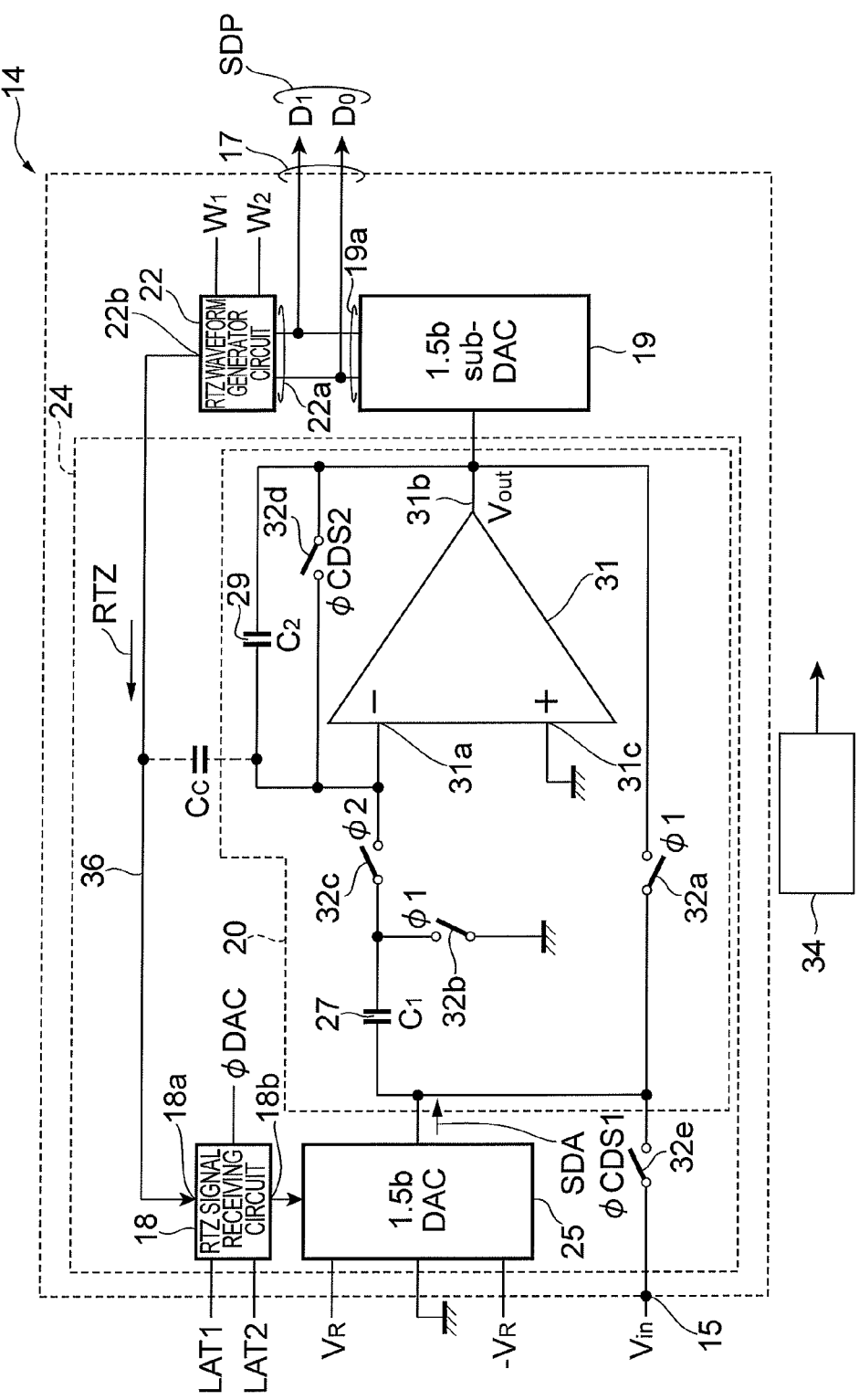
FIG. 3 is a diagram schematically illustrating the A/D converter in accordance with the embodiment.

FIG. 3 is a diagram schematically illustrating the A/D converter in accordance with this embodiment. This A/D converter 14 can replace any of the A/D converters 13a to 13n arranged as illustrated in FIG. 1. The A/D converter 14 includes an input 15, an output 17, a sub-A/D conversion circuit 19, an RTZ waveform generator circuit 22, a D/A conversion circuit 25, a switched-capacitor amplifier circuit 20, and an RTZ signal receiving circuit 18.

The RTZ waveform generator circuit 22 has an input 22a connected to the output 19a of the sub-A/D conversion circuit 19 and generates a return-to-zero (RTZ) signal RTZ by modulating a signal SDP from the output of the sub-A/D conversion circuit 19. The RTZ signal receiving circuit 18 has an input 18a for receiving the return-to-zero signal RTZ from the output 22a of the RTZ waveform generator circuit 22 and generates a digital signal encoding the return-to-zero signal RTZ. This digital signal is stored into a memory circuit within the RTZ signal receiving circuit 18. The value stored in the memory circuit is fed to the D/A conversion circuit 25 through an output 18b of the RTZ signal receiving circuit 18. The switched-capacitor amplifier circuit 20 includes a plurality of capacitors 27, 29, switching devices 32a, 32b, 32c, 32e, and an arithmetic amplifier circuit 31. The switched-capacitor amplifier circuit 20 is constructed by connecting at least one of the capacitors 27, 29 (capacitor 27 in this example) through a switching device (e.g., 32c) to a virtual grounding terminal (e.g., 31a) of the arithmetic amplifier circuit 31. A timing generator circuit 34 generates timing signals $\phi_1$, $\phi_2$, $\phi_{CDS1}$, $\phi_{CDS2}$, which control the switching devices 32a to 32e. In the signal processing circuit 24, the RTZ signal receiving circuit 18 encodes a digital value from the return-to-zero signal RTZ from the output 22a of the RTZ waveform generator circuit 22. Thus encoded signal has a value for controlling the D/A conversion circuit 25 and is held in the memory circuit within the RTZ signal receiving circuit 18. Alternatively, the memory circuit within the RTZ signal receiving circuit 18 may store the return-to-zero signal RTZ from the output 22a of the RTZ waveform generator circuit 22, so that the RTZ signal receiving circuit 18 generates a digital value from the signal within the memory circuit. According to the value stored in the memory circuit, the D/A conversion circuit 25 provides the analog output value SDA. The D/A conversion circuit 25 supplies the analog output value SDA corresponding to the stored value of the memory circuit. The connection among the first and second capacitors 27, 29 and arithmetic amplifier circuit 31 constitutes an SC amplifier. In this SC amplifier, the second input (e.g., non-inverting input) 31c of the arithmetic amplifier circuit 31 is connected to a grounding line.

By connecting the first capacitor 27 between the input of the switched-capacitor amplifier circuit 20 and the first input (e.g., inverting input) 31a of the arithmetic amplifier circuit 31 and the second capacitor 29 between the output (e.g., non-inverting output) 31b of the arithmetic amplifier circuit 31 and the first input (e.g., inverting input) 31a thereof, the signal processing circuit 24 performs signal processing. As a result of the signal processing, an arithmetic value is generated at the output 31b of the arithmetic amplifier circuit 31. This arithmetic value is fed to the output of the signal processing circuit 24. During the signal processing, for example, there is a time when the first input (e.g., inverting input) 31a is connected to one end of the capacitors 27, 29, so that a conductor region equipotential with their connecting node does not have sufficiently low impedance. The equipotential conductive region connected to the input 31a of the arithmetic amplifier circuit 31 is coupled through the parasitic capacitor $C_C$ to a wiring conductor 36 from an output 22b of the RTZ waveform generator circuit 22 to an input 18a of the RTZ signal receiving circuit 18. The potential change on the wiring conductor 36 is transmitted to the equipotential conductor through the parasitic capacitor $C_C$. However, the return-to-zero signal RTZ propagates through the wiring conductor 36 and has two transitions directed opposite to each other.

In this A/D conversion circuit 14, regardless of the magnitude of the capacitive coupling through the parasitic capacitor $C_C$ (whose specific size is hard to estimate in the actual circuit), the noises based on the two transitions directed opposite to each other resultantly cancel each other out even when the node receiving the noises has high impedance.

Figure 4:
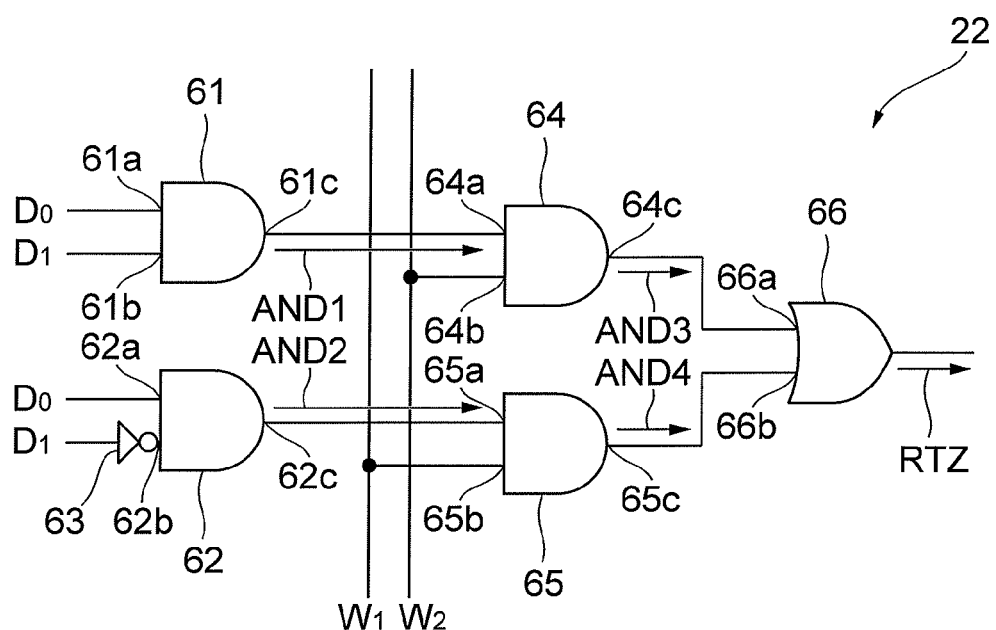
FIG. 4 is a diagram illustrating a circuitry example of an RTZ waveform generator circuit.

FIG. 4 is a diagram illustrating a circuitry example of the RTZ waveform generator circuit 22. The RTZ waveform generator circuit 22 receives signals SDP ($D_0$, $D_1$) from the sub-A/D conversion circuit 19. As can be seen from the following explanation, the RTZ waveform generator circuit 22 can generate the return-to-zero signal RTZ by modulating the signals SDP. In the RTZ waveform generator circuit 22, a plurality of logic gates, e.g., AND (logical conjunction) gates 61, 62, receive the signals $D_0$, $D_1$. In this example, inputs 61a, 61b of the AND gate 61 receives the signals $D_0$, $D_1$, while inputs 62a, 62b of the AND gate 62 receive signals $D_0$, $\_D_1$. Here, the signal $\_D_1$ indicates an inverted signal of the signal $D_1$. For generating the inverted signal, an inverter 63 may be connected to the input 62b of the AND gate 62, for example. An input 64a of an AND gate 64 receives an AND signal AND1 from an output 61c of the AND gate 61, while an input 64b of the AND gate 64 receives a signal W2. An input 65a of an AND gate 65 receives an AND signal AND2 from an output 62c of the AND gate 62, while an input 65b of the AND gate 65 receives a signal W1. Inputs 66a, 66b of an exclusive OR (EXOR) gate 66 receive AND signals AND3, AND4 from outputs 64c, 65c of the AND gates 64, 65, respectively. The exclusive OR gate 66 generates the return-to-zero signal RTZ. Here, the signals W1, W2 are those for generating image data and fed from a 1.5 b sub-A/D conversion circuit.

Figure 5:
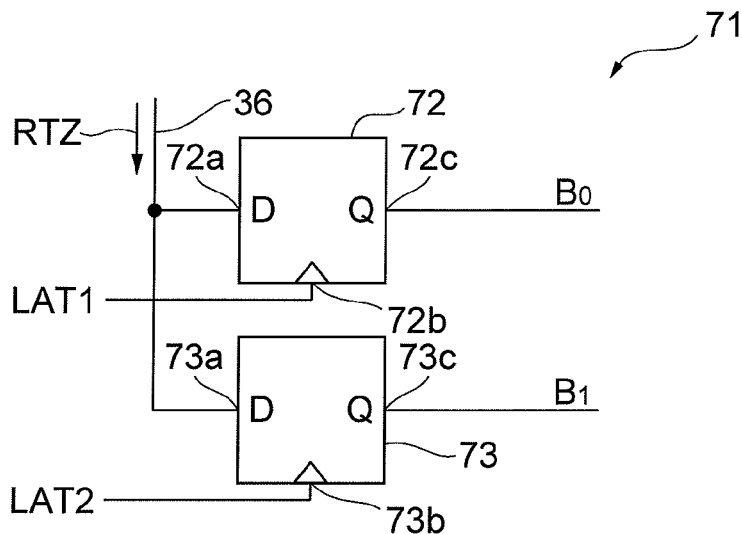
FIG. 5 is a diagram illustrating a circuitry example of an RTZ signal receiving circuit.
Figure 5:
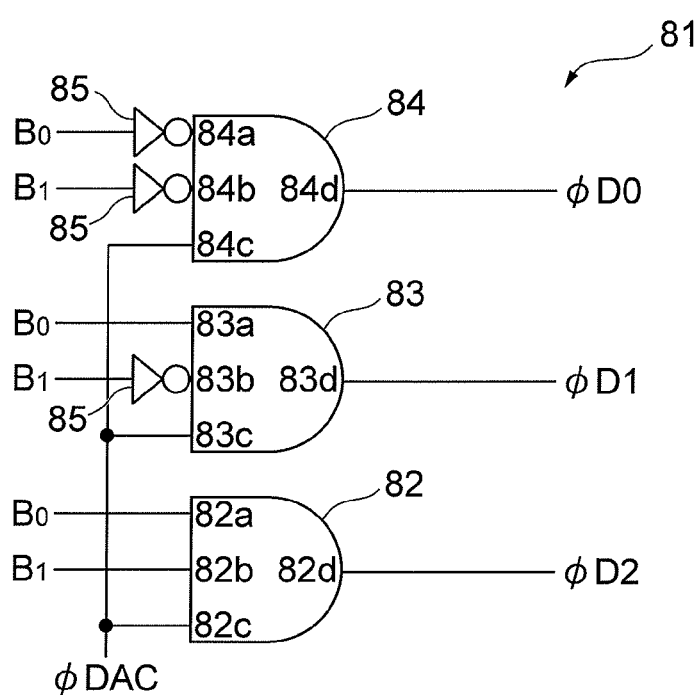
Figure 5:
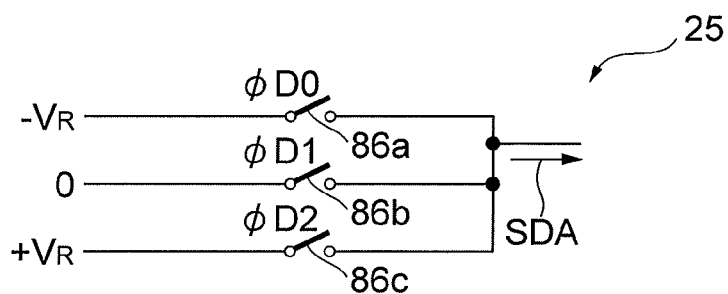

FIG. 5 is a diagram illustrating a circuitry example of the RTZ signal receiving circuit 18 and D/A conversion circuit 25. The RTZ signal receiving circuit 18 stores the return-to-zero signal RTZ from an output 22b of the RTZ waveform generator circuit 22 and encodes a digital value from the return-to-zero signal RTZ. The RTZ signal receiving circuit 18 includes a memory circuit 71 and an encoder 81. Part (a) of FIG. 5 illustrates the memory circuit 71. The memory circuit 71 may include storage circuits which can store one or a plurality of bits, i.e., latch circuits 72, 73 in this example. The return-to-zero signal RTZ is fed to the latch circuits 72, 73 through a wiring conductor 36 connected to inputs 72a, 73a of the latch circuits 72, 73. Latch signals LAT1, LAT2 are fed to latch inputs 72b, 73b of the latch circuits 72, 73, so as to define the latch timings of the latch circuits 72, 73, respectively. The latch circuits 72, 73 store values $B_0$, $B_1$ defined by the latch signals LAT1, LAT2 and feed thus stored values to outputs 72c, 73c, respectively.

Part (b) of FIG. 5 illustrates the encoder 81. The encoder 81 includes a plurality of logic gates such as AND gates. While four AND gates are necessary for encoding 2-bit signals $B_0$, $B_1$, for example, the A/D conversion circuit 14 performs 1.5-bit A/D conversion for each cycle, whereby encoding using three AND gates 82, 83, 84 generates control signals $\phi_{D0}$, $\phi_{D1}$, $\phi_{D2}$. A signal $\phi_{DAC}$ defines a timing for feeding a control signal to the D/A conversion circuit 25. Inputs 82c, 83c, 84c of the AND gates 82, 83, 84 receive the signal $\phi_{DAC}$. Inputs 82a, 82b of the AND gate 82 receive the signals $B_0$, $B_1$, respectively. Inputs 83a, 83b of the AND gate 83 receive the signals $B_0$, $\_B_1$, respectively. Inputs 84a, 84b of the AND gate 83 receive the signals $B_0$, $\_B_1$, respectively. For generating the inverted signals $B_0$, $\_B_1$ of the signals $B_0$, $B_1$, inverters 85 are used for the required inputs of the AND gates. In this encoder 81, outputs 82d, 83d, 84d of the AND gates 82, 83, 84 provide the control signals $\phi_{D0}$, $\phi_{D1}$, $\phi_{D2}$, respectively. These control signals $\phi_{D0}$, $\phi_{D1}$, $\phi_{D2}$ control three switching devices 86a, 86b, 86c within the D/A conversion circuit 25. FIG. 6 illustrates a list of correspondences among output values (0, 1, 2), digital signals ($D_0$, $D_1$), latch signals ($B_0$, $B_1$), and control signals $\phi_{D0}$, $\phi_{D1}$, $\phi_{D2}$ of the sub-A/D conversion circuit 19.

Figure 7:
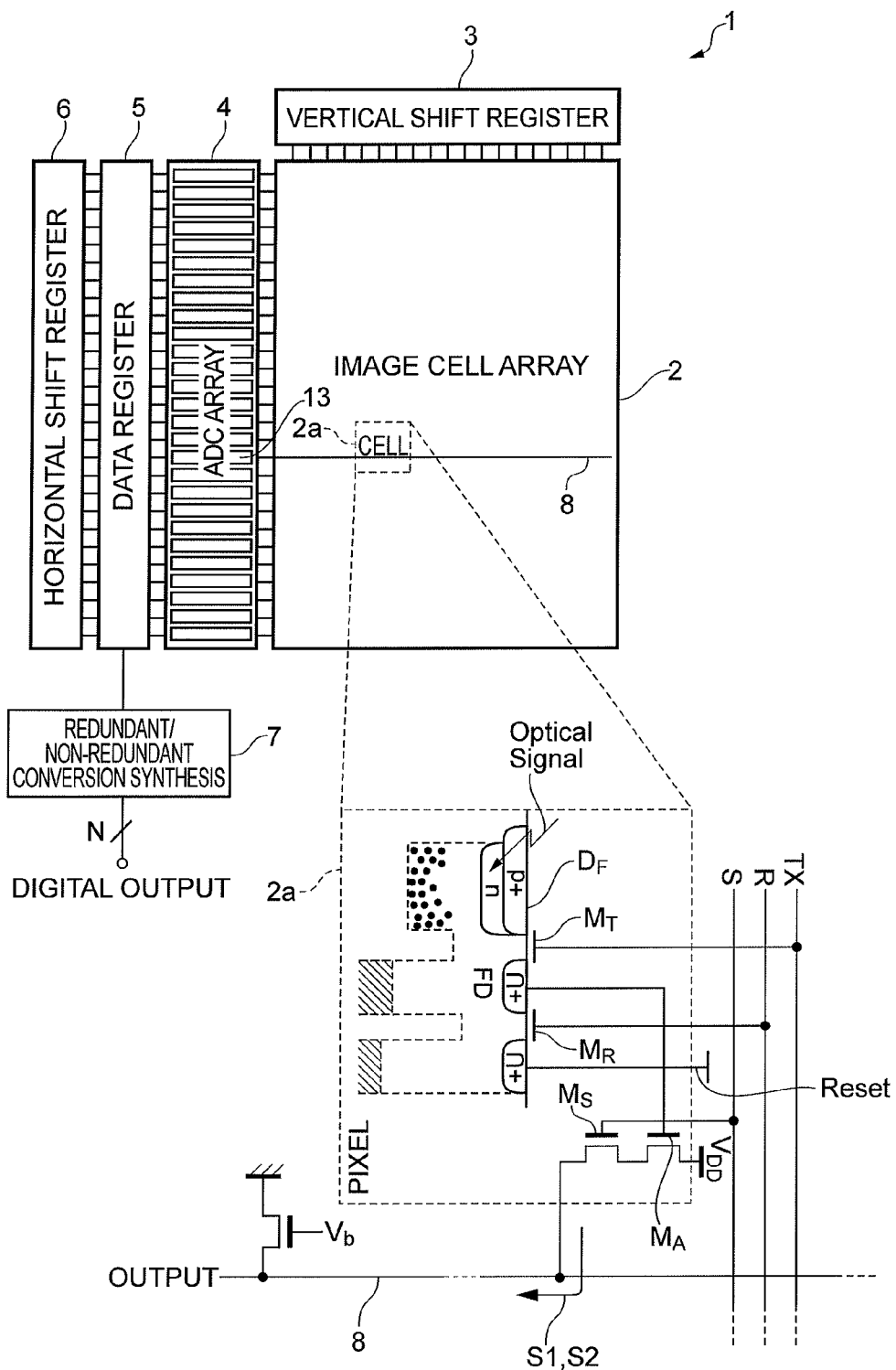
FIG. 7 is a diagram illustrating an image sensor as an example employing the above-mentioned A/D converter.

FIG. 7 is a diagram illustrating an image sensor as an example employing the above-mentioned A/D converter. Referring to FIG. 7, in a CMOS image sensor 1, a sensor array 2 includes an array of sensor circuits 2a each containing a sensor device. A vertical shift register 3 is connected to columns of the sensor array 2, while an A/D converter array 4 is connected to rows of the sensor array 2. The A/D converter array 4 includes a plurality of A/D converters 13 arranged into an array in a column of the image sensor. The A/D converter array 4 is arranged according to the width of each row of the sensor array 2. Hence, in a circuit structure in which the A/D converters 13 are provided for the respective rows, for example, the number of A/D converters 13 equals the number of rows. The individual A/D converters 13 are laid out in conformity to the cell size within the sensor array 2. In the CMOS image sensor 1, sensor circuits 2a of CMOS image sensors are arranged in column and row directions in the sensor array 2. FIG. 7 illustrates a pixel PIXEL of the CMOS image sensor. The pixel PIXEL is an example of the sensor circuit 2a. The application of the A/D converter 13 in accordance with this embodiment is not limited to the specific structures described in the specification.

The sensor circuit explained in the foregoing is applicable to various sensors which can be integrated together with semiconductor circuits in addition to the pixel PIXEL without being restricted to the image sensor. Examples of applicable sensors include distance sensors, magnetic sensors, acceleration sensors, and pressure sensors.

With reference to FIG. 7, the structure of the CMOS image sensor 1 will be explained. The pixel PIXEL generates a first signal S1 in a reset state and a second signal S2 in a photo-induced signal output. The input 13 of the A/D converter 11 is connected to the pixel PIXEL. A data register 5 is connected to the A/D converter array 4, so that an A/D converted value corresponding to a signal from the pixel PIXEL is stored into the data register 5. In response to a signal from a horizontal shift register 6, the data register 5 feeds a digital signal to a redundant representation/non-redundant representation conversion circuit 7. The redundant representation/non-redundant representation conversion circuit 7 generates an N-bit digital code corresponding to the signal from the pixel PIXEL.

In the pixel PIXEL, a photodiode $D_F$ receives light (Optical Signal) for one pixel related to an image. The gate of a select transistor $M_S$ is connected to a column select line S extending in the column direction. The gate of a reset transistor $M_R$ is connected to a reset line R. The gate of a transfer transistor $M_T$ is connected to a transfer select line extending in the column direction. One end of the photodiode $D_F$ is connected to a floating diffusion layer FD. The floating diffusion layer FD is connected to a reset potential line Reset through the reset transistor $M_R$ and to the gate of a transistor $M_A$. One current terminal (e.g., source) of the transistor $M_A$ is connected to a row line 8 through the election transistor $M_S$. According to the amount of charge in the floating diffusion layer FD, the transistor $M_A$ feeds a potential to the row line through the select transistor $M_S$.

In thus constructed pixel, a noise cancel operation is performed as follows. First, a reset control signal R is fed to the reset transistor $M_R$, so as to reset the floating diffusion layer FD. Thus reset level is read through the amplifier transistor $M_A$. The pixel PIXEL generates the first signal S1 when the floating diffusion layer FD is in the reset state. Subsequently, a charge transfer control signal TX is fed to the transfer transistor $M_T$, so as to transfer a photo-induced signal charge from the photodiode $D_F$ to the floating diffusion layer FD. Thereafter, the resulting signal level is read through the transistor $M_A$. The second signal S2 is generated when the floating diffusion layer FD is in the state of accumulating a photo-induced charge. In the second signal S2, the first signal S1 is superposed on a signal indicating the photo-induced charge. The difference between the reset level and the signal level is determined by an A/D converter such as the one illustrated in FIG. 1. As a consequence, noises such as fixed pattern noises caused by fluctuations in characteristics of transistors in the pixel PIXEL and reset noises occurring when resetting the floating diffusion layer are cancelled.

Figure 8:
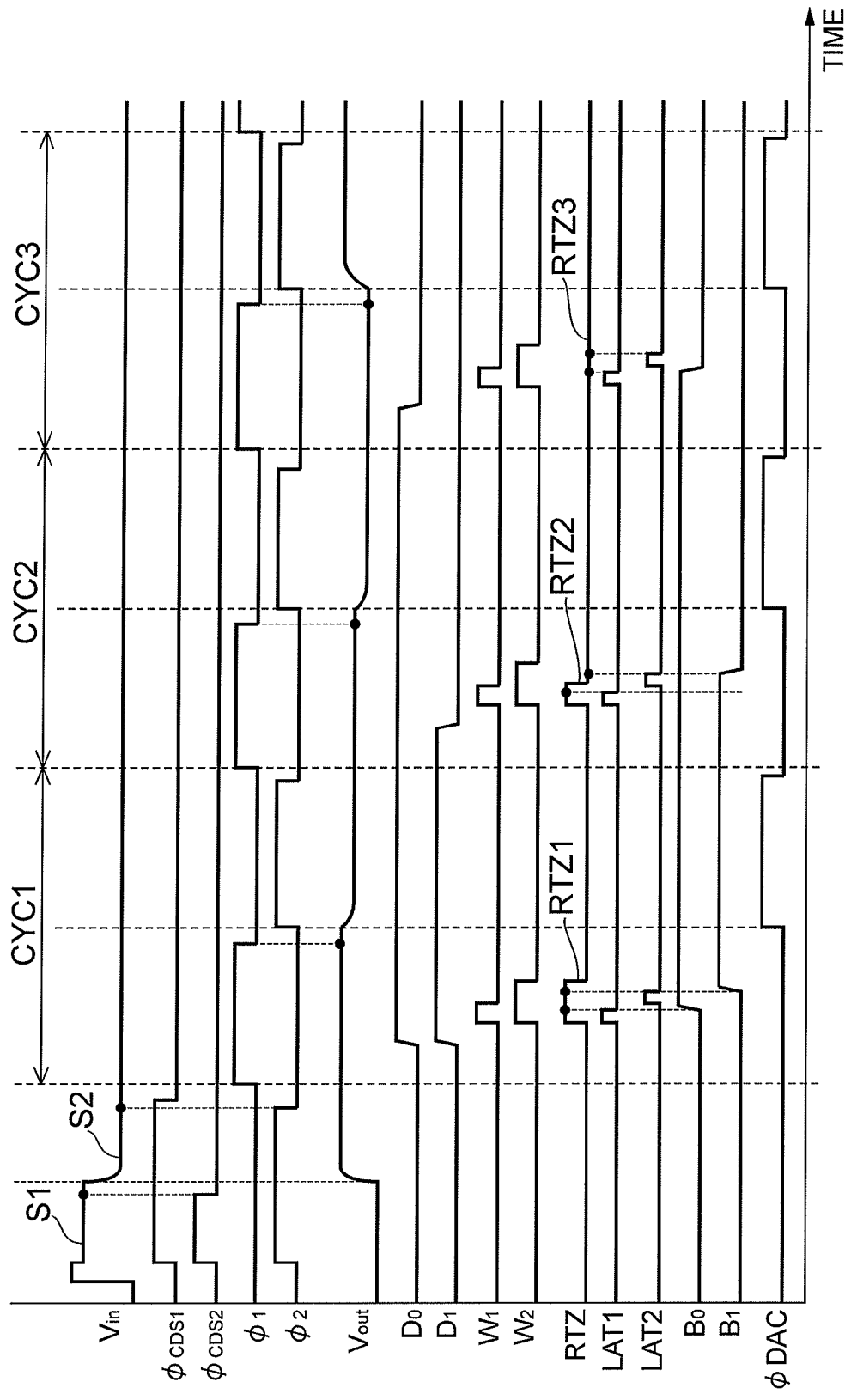
FIG. 8 is a chart illustrating timings for operating the A/D converter in accordance with the embodiment.

FIG. 8 is a chart illustrating timings for operating the A/D converter in accordance with the embodiment. Operations of the A/D converter will be explained with reference to FIGS. 3 and 8. FIG. 8 is a chart illustrating an analog CDS operation and initial three cycles CYC1, CYC2, and CYC3 of an A/D conversion operation. During a period when both of the timing signals $\phi_{CDS1}$, $\phi_{CDS2}$ are "HIGH," the signal S1 from the sensor circuit 2a is received and stored into the capacitor 27. Subsequently, during a period when the timing signals $\phi_{CDS1}$, $\phi_{CDS2}$ are "HIGH" and "LOW," respectively, the signal S2 from the sensor circuit 2a is received, the analog CDS operation is performed in the SC amplifier in the signal processing circuit 23, and the differential signal (S1-S2) is generated at the output 31b of the arithmetic amplifier circuit 31. The sub-A/D conversion circuit 19 generates an A/D converted signal SDP of the differential signal.

The sub-A/D converted values at the initial cycle are: $D_0=1$, $D_1=1$. In response to the signal SDP($D_0$, $D_1$) from the output of the sub-A/D conversion circuit 19, the RTZ waveform generator circuit 22 generates a return-to-zero signal RTZ1 from the signal SDP. This signal RTZ1 propagates through the wiring conductor 36, so as to reach the RTZ signal receiving circuit 18. In the RTZ signal receiving circuit 18, the memory circuit 71 stores digital values ($B_0$, $B_1$) in response to the latch signals LAT1, LAT2.

The sub-A/D converted values at the second cycle are: $D_0=1$, $D_1=0$. In response to the signal SDP($D_0$, $D_1$) from the output of the sub-A/D conversion circuit 19, the RTZ waveform generator circuit 22 generates a return-to-zero signal RTZ2 from the signal SDP. This signal RTZ2 propagates through the wiring conductor 36, so as to reach the RTZ signal receiving circuit 18. In the RTZ signal receiving circuit 18, the memory circuit 71 stores digital values ($B_0$, $B_1$) in response to the latch signals LAT1, LAT2.

The sub-A/D converted values at the third cycle are: $D_0$=0, $D_1$=0. In response to the signal SDP($D_0$, $D_1$) from the output of the sub-A/D conversion circuit 19, the RTZ waveform generator circuit 22 generates a return-to-zero signal RTZ3 from the signal SDP. This signal RTZ3 propagates through the wiring conductor 36, so as to reach the RTZ signal receiving circuit 18. In the RTZ signal receiving circuit 18, the memory circuit 71 stores digital values ($B_0$, $B_1$) in response to the latch signals LAT1, LAT2.

The cyclic A/D conversion operation includes a cyclic operation mode and an arithmetic processing mode. During the period when the signals $\phi_1$ and $\phi_2$ are HIGH and LOW, respectively, in FIG. 8 at each of the cycles CYC1, CYC2, CYC3 in the cyclic A/D conversion operation, the capacitor 27 receives the analog signal from the input 15 or a feedback value through the switch 32a (cyclic operation mode). Both ends of the capacitor 29 are connected to the input 31a and output 31b of the arithmetic amplifier circuit 31, respectively, while the capacitor 27 is separated from the input 31a of the arithmetic amplifier circuit 31 by the switch 32c. Here, the conductors connected to the input 31a of the arithmetic amplifier circuit 31 have higher impedance. The node connected to the capacitor 29 and input 31a keeps its potential.

In each period when the signals $\phi_2$ and $\phi_1$ are HIGH and LOW, respectively, in FIG. 8, the capacitors 27, 29 are connected to the input 31a of the arithmetic amplifier circuit 31. When the signal SDA is fed from the D/A conversion circuit 25 to the capacitor 27 while in this connection, the SC amplifier performs an arithmetic operation (arithmetic processing mode). The capacitors 27, 29 are connected to the input 31a of the arithmetic amplifier circuit 31, while both ends of the capacitor 29 are connected to the input 31a and output 31b of the arithmetic amplifier circuit 31, respectively. The conductors connected to the input 31a of the arithmetic amplifier circuit 31 also have higher impedance here. The node connected to the capacitors 27, 29 keeps its potential. In these connections, the virtual grounding terminal (input 31a here) is in a virtual grounding state.

In this example, in the cyclic operation mode, the return-to-zero signal is sent from the sub-A/D conversion circuit 19 to the D/A conversion circuit 25. When necessary, the return-to-zero signal may be sent at the initial stage of the arithmetic processing mode.

The duration of the period when the return-to-zero signal RTZ1 is in the HIGH state differs from that of the period when the return-to-zero signal RTZ2 is in the HIGH state, and similarly differs from that of the period (zero) when the return-to-zero signal RTZ3 is in the HIGH state. These return-to-zero signals RTZ1, RTZ2, RTZ3 propagate through the wiring conductor 36, so as to reach the RTZ signal receiving circuit 18. The switched-capacitor amplifier circuit 20 processes the analog signal for the A/D conversion. The return-to-zero signals RTZ propagate through the wiring conductor 36, which is coupled through the parasitic capacitor $C_C$ to the node within the switched-capacitor amplifier circuit 20. Therefore, at the time of processing, the node within the switched-capacitor amplifier circuit 20 may be disturbed through the parasitic capacitor $C_C$ from the wiring conductor 36. When the impedance of the node is not sufficiently low, the digital transitions of the return-to-zero signals RTZ1, RTZ2, RTZ3 propagate as noises to the above-mentioned node through the parasitic capacitor $C_C$. Since the number of transitions (from the first voltage value L to the second voltage value H and from the second voltage value H to the first voltage value L) is zero or an even number in each of the return-to-zero signals RTZ1, RTZ2, RTZ3, the noise at the first transition is substantially cancelled by the noise of the second transition having the opposite polarity. Therefore, even when the above-mentioned node has high impedance, the resulting residual noise is very low.

Figure 9:
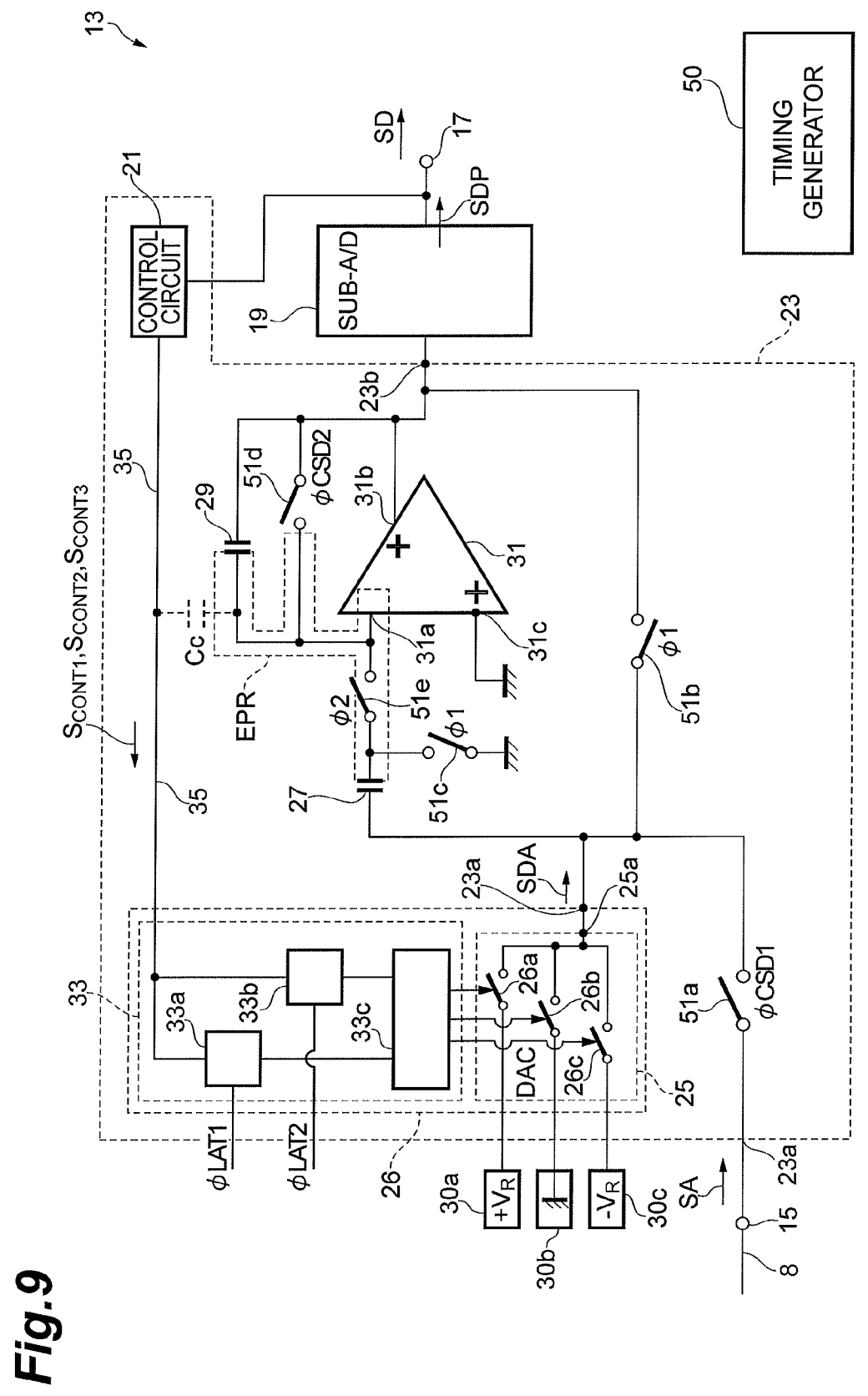

FIG. 9 is a diagram schematically illustrating the structure of a cyclic A/D converter. In the cyclic A/D conversion, A/D conversion is performed by increments of one or several bits which are smaller than the total number of digital bits. For example, the A/D conversion of several bits of the analog signal is performed, and the arithmetic amplifier circuit subtracts a signal corresponding to the bit value from the result, so as to generate an arithmetic value. This arithmetic value is A/D converted, and a signal corresponding to the converted bit value is subtracted therefrom by the arithmetic amplifier circuit, so as to generate an arithmetic value for the next cyclic operation. This operation is repeated until a digital signal having a desirable bit number is obtained. In many cases of cyclic A/D converters, the D/A conversion circuit 25 is located closer to the sensor array 2 than is the sub-A/D conversion circuit 19. The signal processing circuit 23 connects the second capacitor 29 between the output 31b and input 31a of the arithmetic amplifier circuit 31 and separates the first capacitor 27 from the input 31a. The first capacitor 27 receives an analog value through the input 15 or a switch 51b, while the second capacitor 29 holds the analog value (potential) at the input 31a. By connecting the first capacitor 27 between the input 23a of the signal processing circuit 23 or the output 25a of the D/A conversion circuit 25 and the input 31a of the arithmetic amplifier circuit 31 and the second capacitor 29 between the output 31b and input 31a of the arithmetic amplifier circuit 31, the signal processing circuit 23 performs signal processing. The input 23a is connected to one end of the first capacitor 27 through a switch 51a. The cyclic A/D converter also includes a feedback path for returning the arithmetic value generated by the signal processing from the output 31b of the arithmetic amplifier circuit 31 to the input of the SC amplifier. This feedback path includes the switch 51b. In this cyclic A/D converter 13, the sub-A/D conversion circuit 19 is placed near the output of the A/D converter 13. The conductor 35 for the control signal extends from the output side of the A/D converter 13 to the input side thereof.

Figure 10:
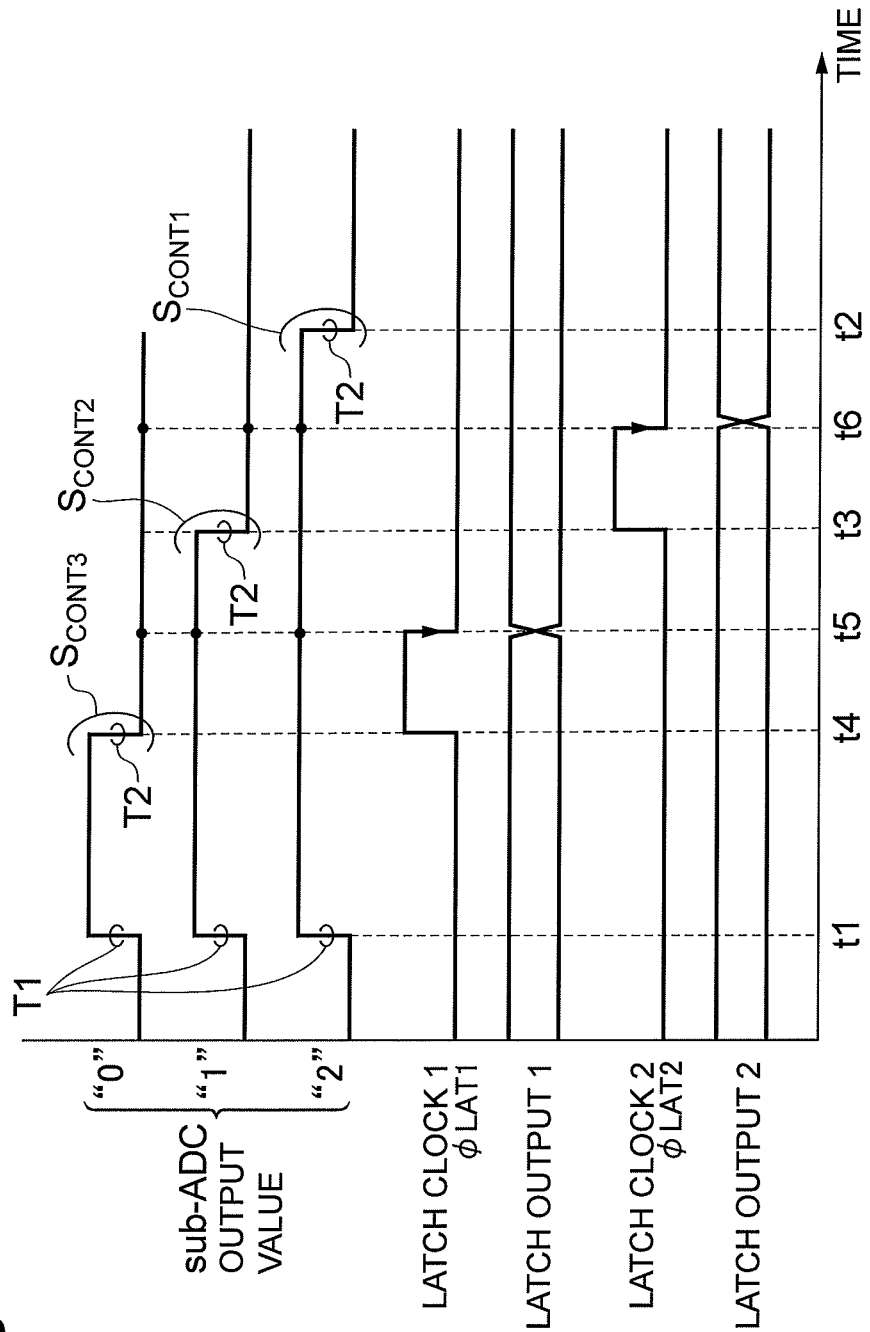
FIG. 10 is a timing chart illustrating operations of the cyclic A/D converter illustrated in FIG. 9.

FIG. 10 is a timing chart illustrating operations of the cyclic A/D converter illustrated in FIG. 9. The cyclic A/D converter 13 illustrated in FIG. 9 performs 1.5-bit A/D conversion for each cyclic operation. For this purpose, the D/A conversion circuit 25 provides ternary analog values (e.g., +$V_R$, zero, -$V_R$). Therefore, the D/A conversion circuit 25 includes three switches 26a, 26b, 26c, which operate in response to the above-mentioned control signal. Three reference signals (+$V_R$, zero, -$V_R$) are provided by voltage sources 30a, 30b, 30c. For generating a ternary D/A signal SDA, the output value SDP of the sub-A/D conversion circuit 19 is fed to the control circuit 21. The memory circuit 33 has storage circuits 33a, 33b, such as latch circuits, for storing the three control signals. The storage circuits 33a, 33b store the control signals in response to storage signals $\phi_{LAT1}$, $\phi_{LAT2}$, respectively, and hold thus stored values. The control circuit 21 generates control signals $S_{CONT1}$, $S_{CONT2}$, $S_{CONT3}$ for generating the ternary D/A signal SDA.

The switches 51a, 51b, 51c, 51d, 51e in the following explanation respond to signals provided by a timing generator

50. The cyclic A/D converter 13 performs a reset operation before receiving the analog signal through the input 15. In the reset operation, the switches 51*d*, 51*e* are closed in response to the signals $\phi_{CDS2}$, $\phi_2$.

Subsequently, the cyclic A/D converter 13*a* receives the analog signal SA through the input 15. Here, the switch 51*a* is closed in response to the signal $\phi_{CDS1}$, and the switches 51*b*, 51*c* are closed in response to the signal $\phi_1$. The switches 51*d*, 51*e* open in response to the signals $\phi_{CDS2}$, $\phi_2$, respectively.

The analog signal SA is stored in the capacitor 27. Here, the output of the D/A conversion circuit 25 is in a high impedance state (HiZ). The output 31*b* of the arithmetic amplifier circuit 31 is connected to the input 31*a* of the arithmetic amplifier circuit 31 through the capacitor 29, while the conductor region connected to the input 31*a* in the SC amplifier in the connection does not have sufficiently low impedance. The analog signal SA is fed to the sub-A/D conversion circuit 19 through the switch 51*b*, whereby the sub-A/D conversion circuit 19 generates a 2-bit partial A/D converted value SDP. For this purpose, the sub-A/D conversion circuit 19 includes two comparators and provides the results of comparisons in the individual comparators as the A/D converted value SDP. The two comparators receive the reference values $+V_R$, $-V_R$, respectively.

After fetching the analog signal, the signal processing circuit 23 opens the switches 51*a*, 51*d* in response to the signals $\phi_{CDS1}$, $\phi_{CDS2}$, respectively, and the switches 51*b*, 51*c* in response to the signal $\phi_1$. It closes the switch 51*e* in response to the signal $\phi_2$. This connection causes the capacitors 27, 29 and arithmetic amplifier circuit 31 to construct an SC amplifier in the signal processing circuit 23. Here, the conductor region EPR is a high-impedance node connected to the virtual grounding terminal of the arithmetic amplifier circuit 31 and capacitively coupled to the conductor 35 through the parasitic capacitor $C_C$.

In the connection, the control circuit 21 generates a signal (one of the control signals $S_{CONT1}$, $S_{CONT2}$, $S_{CONT3}$) corresponding to the received A/D converted value SDP. This signal propagates through the conductor 35, so as to reach the memory circuit 33.

While the timing chart of FIG. 10 shows all of the control signals $S_{CONT1}$, $S_{CONT2}$, $S_{CONT3}$, only one of them is generated in each cyclic operation. The control signals $S_{CONT1}$, $S_{CONT2}$, $S_{CONT3}$ are transmitted during the period when the SC amplifier is constructed by the capacitors 27, 29 and arithmetic amplifier circuit 31. During this period, the conductor region EPR is placed in a high impedance state in terms of both direct and alternating currents. The start of the transmission period is after the start of the SC amplifier operation period, while the end of the transmission period is before the end of the SC amplifier operation period. When generating a signal, each of the control signals $S_{CONT1}$, $S_{CONT2}$, $S_{CONT3}$ causes a first transition T1 at time t1 in cyclic operation timings. The control signal $S_{CONT1}$ has the longest duration and causes a second transition T2 at time t2. The control signal $S_{CONT2}$ has the second longest duration and causes the second transition T2 at time t3. The control signal $S_{CONT3}$ has the shortest duration and causes the second transition T2 at time t4. The latch timing of the storage circuit 33*a* is defined by the signal $\phi_{LAT1}$, and the stored value of the storage circuit 33*a* is determined at time t5. The latch timing of the storage circuit 33*b* is defined by the signal $\phi_{LAT2}$, and the stored value of the storage circuit 33*b* is determined at time t6. The second transition T2 of the control signal $S_{CONT1}$ is located before the time t5, while the second transition T2 of the control signal $S_{CONT2}$ is located before the time t6.

When the control circuit 21 provides the control signal $S_{CONT1}$, the stored value of the storage circuit 33*a*, which is determined at the time t5, is "1." The stored value of the storage circuit 33*b*, which is determined at the time t6, is "1." When the control circuit 21 provides the control signal $S_{CONT2}$, the stored value of the storage circuit 33*a*, which is determined at the time t5, is "1." The stored value of the storage circuit 33*b*, which is determined at the time t6, is "0." When the control circuit 21 provides the control signal $S_{CONT3}$, the stored value of the storage circuit 33*a*, which is determined at the time t5, is "0." The stored value of the storage circuit 33*b*, which is determined at the time t6, is "0."

For example, a decoder circuit 33*c* converts the stored values of the storage circuits 33*a*, 33*b* into a switching signal for controlling the opening and closing of the switches 26*a* to 26*c*. According to the switching signal, one of the switches 26*a* to 26*c* connects the signal SDA to one end of the capacitor 27. In response to the application of the signal SDA, an arithmetic value is generated by the initial cyclic operation.

The sub-A/D conversion circuit 19 feeds this arithmetic value as the second signal SDP to the output 17. The signal SDP is also fed to the control circuit 21, so as to generate a control signal (one of the control signals $S_{CONT1}$, $S_{CONT2}$, $S_{CONT3}$) for the second cyclic operation. This control signal propagates through the conductor 35 and then is stored in the memory circuit 33. The D/A conversion circuit 25 feeds a signal SDA corresponding to the stored value of the memory circuit 33 to one end of the capacitor 27. The operation of cyclic A/D conversion is repeated until a digital signal having a desirable number of bits is obtained. In each operation of cyclic A/D conversion, the control signal from the control circuit 21 to the memory circuit 33 has a waveform constituted by two transitions, whereby the noises based on the two transitions cancel each other out. This reduces the noises to the conductor region EPR of the SC amplifier.

In this embodiment, a ternary (1.5-bit) digital value is generated in one operation of cyclic A/D conversion. A binary (1-bit) digital value may also be generated in one operation of cyclic A/D conversion. In this A/D conversion, the D/A conversion circuit 25 provides two signals SDA. The memory circuit 33 includes one storage circuit.

Figure 11:
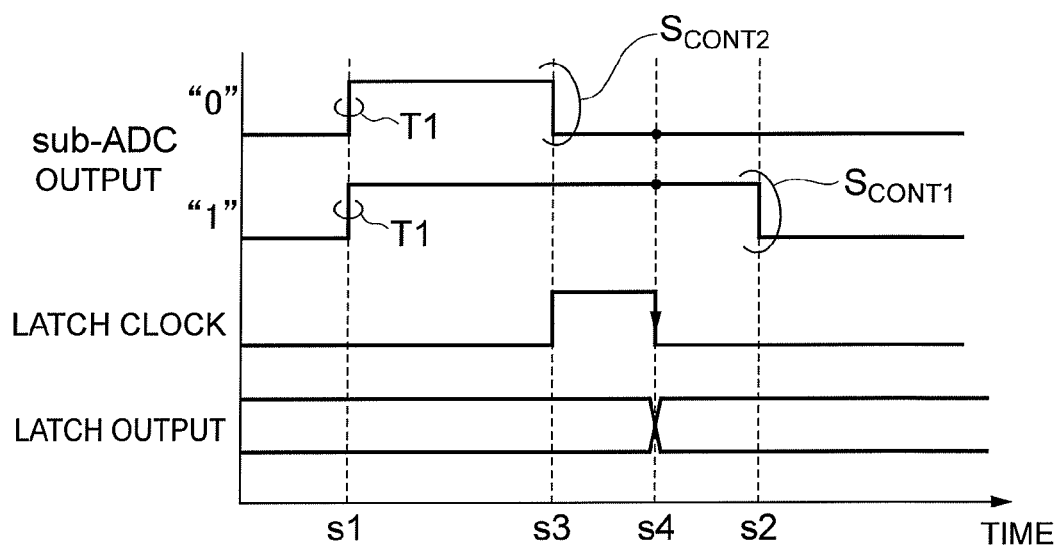
FIG. 11 is a chart illustrating waveforms of control signals for controlling a D/A conversion circuit providing a binary signal SDA.

FIG. 11 is a chart illustrating waveforms of control signals for controlling a D/A conversion circuit providing a binary signal SDA. While the timing chart of FIG. 11 shows both of the control signals $S_{CONT1}$, $S_{CONT2}$, only one of them is generated in each cyclic operation. When generating a signal, each of the control signals $S_{CONT1}$, $S_{CONT2}$ causes the first transition T1 at time s1 in cyclic operation timings. The control signals $S_{CONT1}$ has the longer duration and causes the second transition T2 at time s2. The control signals $S_{CONT2}$ has the shorter duration and causes the second transition T2 at time s3. The storage timing of a single storage circuit is defined by a latch clock signal, and the stored value of the storage circuit is determined at time s4. The second transition T2 of the control signal $S_{CONT1}$ is located before time s4. When the control circuit 21 provides the control signal $S_{CONT1}$, the stored value of the storage circuit, which is defined at the time s4, is "1." When the control circuit 21 provides the control signal $S_{CONT2}$, the stored value of the storage circuit, which is defined at the time s4, is "0."

Figure 12:
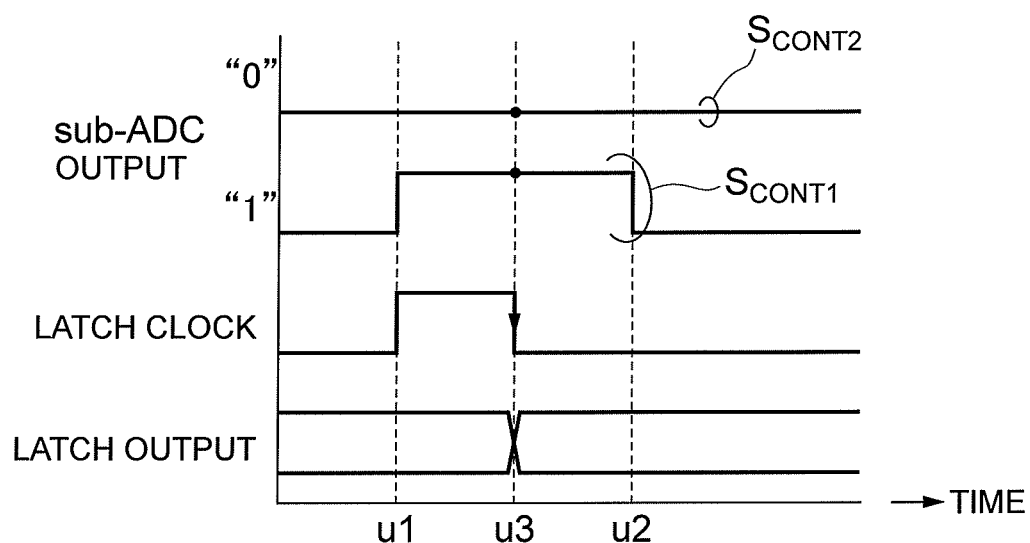
FIG. 12 is a chart illustrating waveforms of control signals for controlling a D/A conversion circuit providing a binary signal SDA.

FIG. 12 is a chart illustrating waveforms of control signals for controlling a D/A conversion circuit providing a binary signal SDA. While the timing chart of FIG. 12 shows both of the control signals $S_{CONT1}$, $S_{CONT2}$, only one of them is generated in each cyclic operation. In this example, the control signal $S_{CONT2}$ is a signal having a fixed value without transitions. When generating a signal having a transition, the control signal $S_{CONT1}$ causes the first transition T1 at time u1 in cyclic operation timings. The control signal $S_{CONT2}$ causes the second transition T2 at time u2. The storage timing of a single storage circuit is defined by a latch clock signal, and the stored value of the storage circuit is determined at time u3. When the control circuit 21 provides the control signal $S_{CONT1}$, the stored value of the storage circuit, which is defined at the time u3, is "1." When the control circuit 21 provides the control signal $S_{CONT2}$, the stored value of the storage circuit, which is defined at the time u3, is "0."

During a period when the input of the arithmetic amplifier circuit 31 connected to the capacitors 27, 29 or the input of the arithmetic amplifier circuit 31 connected to at least one of the capacitors 27, 29 is in a high impedance state in terms of both direct and alternating currents, as the foregoing examples illustrate, a D/A converter can be operated by a control signal having a waveform including the same number of transitions from the first voltage level to the second voltage level and from the second voltage level to the first voltage level. When the waveform of the control signal controlling the D/A conversion circuit has an even number (including zero) of transitions, the coupling noises caused by the transitions are reduced.

In the inventor's estimation, capacitive coupling through a parasitic capacitor applies a noise having a voltage amplitude of about 3 millivolts (mV) to the conductor region EPR in a typical A/D converter. RTZ-encoding the control signal from the control circuit 21 to the D/A conversion circuit 25, for example, applies both of a noise having a voltage amplitude of about 3 millivolts and a noise having a voltage amplitude of about 1 to 3 millivolts to the potential region EPR. In 12-bit A/D conversion at a full-scale voltage of 1 volt, 1 LEB is 0.25 millivolt (mV), whereby the noise level at 3 mV is equivalent to 12 LEB. The noise level of 3 mV is a large value.

Figure 13:
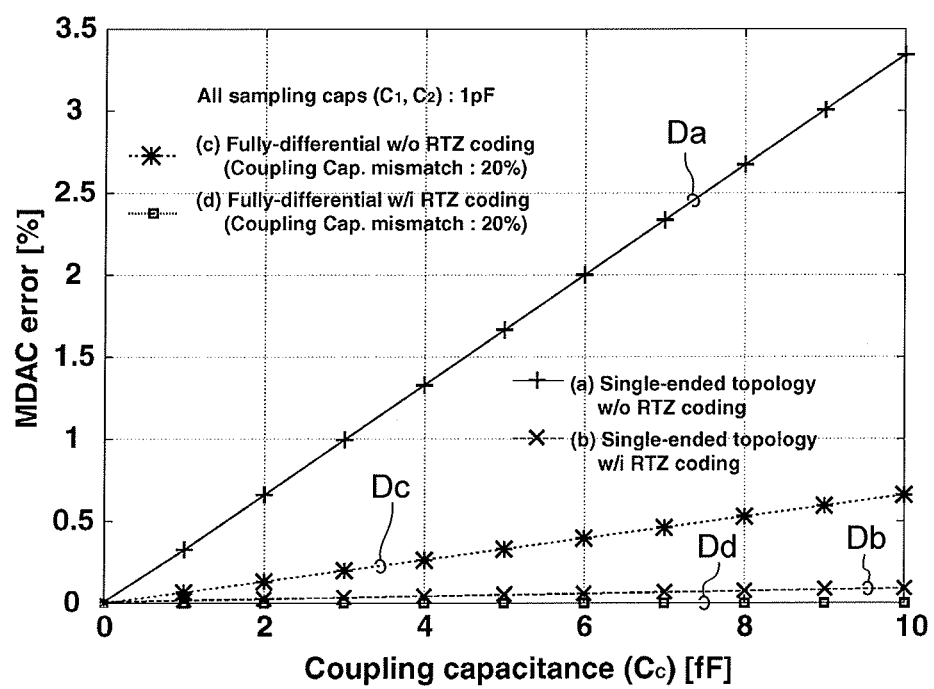
FIG. 13 is a graph illustrating results of a simulation of errors occurring when coupling is generated at a virtual grounding point through a parasitic capacitor $C_C$ in an amplifier circuit within a cyclic A/D converter.

FIG. 13 is a chart in which the relationship between the error occurring when the wiring for a control signal from a comparator within a sub-A/D conversion circuit to a D/A conversion circuit in an amplifier circuit (MDAC: Multiplying D/A converter) within a cyclic A/D converter produces coupling with an inverting input (virtual grounding point) of an arithmetic amplifier circuit through the parasitic capacitor $C_C$ and the value of the parasitic capacitor $C_C$ is determined by a simulation. Each of the capacitors 27, 29 within the signal processing circuit 23 illustrated in FIG. 9 is 1 picofarad. Referring to FIG. 13, characteristic lines Da, Db, Dc, Dd are represented. The error obtained by the simulation is represented for each of the respective cases where the arithmetic amplifier circuit 31 is a fully differential circuit and a single-ended circuit. In each of the cases, the influence of noises is remarkably suppressed in terms of accuracy by using RTZ encoding. In the single-ended circuit, the influence of noises is reduced to about 1/30. By using RTZ encoding, the fully differential circuit can perform arithmetic operations for signal processing without substantially being affected by errors caused by coupling noises.

FIG. 14 is a diagram schematically illustrating the structure of another A/D converter. In this A/D conversion, the sub-A/D conversion circuit 19 generates an A/D converted value having one or several bits which are smaller than the total digital bit number. For example, several bits of an analog signal are A/D converted, and a signal corresponding to the number of bits is subtracted from the result, so as to generate an arithmetic value SAR indicating the residue. The arithmetic value SAR is held in a hold circuit 61. In many cases of the A/D converter 13, the sub-A/D conversion circuit 19 is located closer to the sensor array 2 than is the D/A conversion circuit 25. In the A/D converter 13, the sub-A/D conversion circuit 19 is placed near the input of the A/D converter 13. The conductor (conductor 35 in FIG. 1) for the control signal extends from the input side of the A/D converter 13 to the output side thereof.

In the A/D converter 13, as FIG. 14 illustrates, the signal processing circuit 23 includes a D/A converter 26, capacitors 27, 27a, 27b, and an arithmetic amplifier circuit 31. The D/A converter 26 includes first and second D/A conversion units 28a, 28b, each of which contains a D/A conversion circuit 25 and a memory circuit 33. For providing a D/A value, each of the first and second D/A conversion units 28a, 28b is connected to voltage sources 30d, 30e.

When the signal processing circuit 23 constructs an SC amplifier, one end of the capacitor 27 is connected to one end of the capacitor 29 and the first input 31a of the arithmetic amplifier circuit 31, so as to form the conductor region EPR. In another example, one end of the capacitor 27 is separated from the input 31a of the arithmetic amplifier circuit 31, while one end of the capacitor 29 is connected to the input 31a of the arithmetic amplifier circuit 31, so as to form the conductor region EPR.

For achieving desirable operations, the signal processing circuit 23 includes one or a plurality of switches controlled by a timing generator 60. These switches are arranged at positions similar to those of the switches 51a to 51e in FIG. 9, for example. The capacitors 27a, 27b, 27, 29 and arithmetic amplifier circuit 31 may be connected through these switches. When the signal processing circuit 23 constructs the SC amplifier, one end of the capacitor 27b, one end of the capacitor 27a, one end of the capacitor 27, one end of the capacitor 29, and the first input 31a of the arithmetic amplifier circuit 31 are connected together, so as to form the conductor region EPR. Here, an output 24a of the first D/A conversion unit 28a is connected through the capacitor (capacitance: 2C) 27a to one end of the capacitor 27, one end of the capacitor 29, one end of the capacitor 27b, and the first input 31a of the arithmetic amplifier circuit 31. An output 24b of the second D/A conversion unit 28b is connected through the capacitor (capacitance: C) 27b to one end of the capacitor 27, one end of the capacitor 29, one end of the capacitor 27a, and the first input 31a of the arithmetic amplifier circuit 31.

The conductor region EPR is also capacitively coupled through a parasitic capacitor to the conductor 35 acting as a propagation path for the control signal in the signal processing circuit 23.

Operations of the A/D converter 13 illustrated in FIG. 14 will now be explained. A switch 63a is turned on in response to a signal $\phi_R$, so that a reset level signal S1 of an output signal from the sensor circuit 2a within the cell array 2 is sampled into the capacitor 27. Thereafter, the switch 63a is turned off in response to the signal $\phi_R$, so that a level signal S2 of the output signal from the sensor circuit 2a is received by the capacitor 27, and signal processing is performed by the capacitors 27, 29 and the arithmetic amplifier circuit 31. The signal processing at this time generates and amplifies a differential signal (S1-S2). The connection for this signal processing constructs the SC amplifier.

Here, the sub-A/D conversion circuit 21 performs 2-bit A/D conversion, so as to generate an A/D converted value of the difference between the reset level S1 and the signal level S2, and, according to the results thereof, controls the quaternary D/A converter 26. Thus amplified signal is represented by the following expression:

$$V_{OUT} = 4 \times (S1 - S2) D \times (V_{R1} - V_{R2}).$$

The amplification factor, 4, is defined by the ratio of the capacitor 27 (capacitance: 4C) to the capacitor 29 (capacitance: C). $V_{R1}$ and $V_{R2}$ are determined such that the output of the SC amplifier and $(V_{R1}-V_{R2})$ attain positive values. The 2-bit A/D converted value D is defined as follows:
D: the input analog value range 0: $(S1-S2) \leq (V_{R1}-V_{R2})/4$ 1: $(V_{R1}-V_{R2})/4 < (S1-S2) \leq (V_{R1}-V_{R2})/2$ 2: $(V_{R1}-V_{R2})/2 < (S1-S2) \leq 3 \times (V_{R1}-V_{R2})/2$ 3: $3 \times (V_{R1}-V_{R2})/4 \leq (S1-S2)$ With respect to the output of the 2-bit A/D conversion circuit, the value D attains one of the four values 0, 1, 2, and 3, by which the arithmetic value $V_{OUT}$ becomes the smallest. In other words, the A/D converter 13 operates such that the arithmetic value $V_{OUT}$ is as mentioned above.

In response to the 2-bit signal from the sub-A/D conversion circuit 19, the control circuit 21 generates a control signal $S_{CONT1}$ for controlling the first and second D/A conversion units 28a, 28b.

As the control signal $S_{CONT}$, the control signals $S_{CONT1}$, $S_{CONT2}$ having the waveforms connected in FIGS. 10 to 12 can be used. Since each of these control signals has two transitions T1, T2, digital noises to the conductor region EPR are reduced. The control signal $S_{CONT}$ is stored into the storage circuits 33a, 33b within the memory circuit 33. The D/A conversion circuit in the first D/A conversion unit 28a feeds the D/A value $V_{R1}$ or $V_{R2}$ to the capacitor 27a weighted according to the bit position of A/D conversion. The D/A conversion circuit in the second D/A conversion unit 28b feeds the D/A value $V_{R1}$ or $V_{R2}$ to the capacitor 27b weighted according to the bit position of A/D conversion.

The A/D conversion of the difference between the reset level S1 and the signal level S2 will now be explained in terms of 2-bit A/D conversion. Signals $\phi_A$, $\phi_B$, $\phi_C$, $\phi_D$ are fed to switches 26d, 26e of the D/A conversion circuit 25 in the first and second D/A conversion units 28a, 28b. Before the sub-A/D conversion circuit 19 performs the A/D conversion of the signal level S2, the signals are set such that ($\phi_A=\phi_C=1$, $\phi_B=\phi_D=0$. After the A/D conversion of the signal level S2, these signals $\phi_A$ to $\phi_C$ are set as follows:

D: $\phi_A$, $\phi_B$, $\phi_C$, $\phi_D$
  0: 1→1, 0→0, 1→1, 0→0
  1: 1→0, 0→1, 1→1, 0→0
  2: 1→1, 0→0, 1→0, 0→1
  3: 1→0, 0→1, 1→0, 0→1

Such operations generate the output value $V_{OUT}$ in the signal processing circuit 23.

The switch 61a is turned on in response to the signal $\phi_S$, so that the output value $V_{OUT}$ is sampled and held (stored) into a hold capacitor $C_S$. As already explained, the A/D converter is arranged for each row of the sensor array 2, so that, in the case of reading the j-th row line during signal reading (horizontal transfer), the stored charge flows into an output line $L_{OUT}$ when the signal $\phi_H(j)=1$, so as to be read.

Thus read analog residual signal SDR is subjected to subsequent signal processing (e.g., A/D conversion processing for lower bits).

Employing the RTZ transfer scheme in control signals for D/A conversion circuits is effective in any of modes in which a sub-A/D conversion circuit is located on the sensor array side and data register side as illustrated in FIGS. 1, 9, and 14. When a virtual grounding terminal of an arithmetic amplifier circuit is coupled through a parasitic capacitor to a conductor line acting as a propagation path for a digital control signal, errors are generated by coupling noises. As explained in the foregoing, using control signals such as RTZ codes can reduce the influence of coupling noises.

Though the principle of the present invention has been illustrated and explained in preferred embodiments, it is clear for those skilled in the art that the present invention can be changed in terms of arrangement and details without deviating from such principle. The present invention is not limited to the specific structures disclosed in the embodiments. Therefore, a right is demanded for the claims and all the modifications and changes resulting from the scope and spirit thereof.

INDUSTRIAL APPLICABILITY

As explained in the foregoing, the embodiments can provide an A/D conversion integrated circuit including a plurality of A/D converters which can inhibit noises from being propagated by capacitive coupling from a conductor which transmits a digital signal.

REFERENCE SIGNS LIST

1 . . . CMOS image sensor; 2 . . . sensor array; 2a . . . sensor circuit; 4 . . . A/D converter array; PIXEL . . . pixel; S1 . . . first signal in a reset state; S2 . . . second signal in photo-induced signal output; 5 . . . data register; 6 . . . horizontal shift register; 7 . . . redundant representation/non-redundant representation conversion circuit; 11 . . . A/D conversion integrated circuit; 13a to 13n . . . A/D converter; 13, 14 . . . A/D converter; 15 . . . input of the A/D converter; 17 . . . output of the A/D converter; 18 . . . RTZ signal receiving circuit; 19 . . . sub-A/D conversion circuit; 20 . . . switched-capacitor amplifier circuit; 21 . . . control circuit; 23 . . . signal processing circuit; SA . . . analog signal; SD . . . digital signal; $S_{CONT}$ . . . control signal; L1, L2 . . . voltage level; 22 . . . RTZ waveform generator circuit; 25 . . . D/A conversion circuit; 26 . . . D/A converter; 26a, 26b, 26c . . . switch; 27, 29 . . . capacitor; 28a, 28b . . . D/A conversion unit; 31 . . . arithmetic amplifier circuit; 32a, 32b, 32c, 32d, 32e . . . switching device; 33 . . . memory circuit; $\phi_{LAT0}$, $\phi_{LAT1}$, $\phi_{LAT2}$ . . . latch signal; $\phi_1$, $\phi_2$, $\phi_{CDS1}$, $\phi_{CDS2}$, $\phi_{DAC}$ . . . timing signal; EPR . . . conductor region; 30a, 30b, 30c, 30d, 30e . . . voltage source; 33a, 33b . . . storage circuit; 33c . . . decoder circuit; 35 . . . conductor; 41 . . . A/D converter; 43 . . . D/A conversion circuit; 45 . . . sub-A/D conversion circuit; 51, 51b, 51c, 51d, 51e . . . switch; SDA . . . D/A signal; $S_{CONT1}$, $S_{CONT2}$, $S_{CONT3}$ . . . control signal; T1, T2 . . . control signal transition; 34, 50, 60 . . . timing generator; $+V_R$, $-V_R$ . . . reference value; SAR . . . arithmetic value indicating a residue; 63a . . . switch; 27a, 27b . . . capacitor

The invention claimed is:
1. An A/D conversion integrated circuit including a plurality of A/D converters;
  each A/D converter comprising:
  an input for receiving an analog signal to be A/D converted;
  an output for providing at least a part of a digital signal having a predetermined number of bits representing the analog signal;
  a sub-A/D conversion circuit for generating a sub-digital signal representing one or a plurality of bit values in the digital signal in response to the analog signal and feeding the sub-digital signal to the output;
  an RTZ waveform generator circuit, connected to an output of the sub-A/D conversion circuit for generating an RTZ signal having modulated the sub-digital signal;

a D/A conversion circuit;
a switched-capacitor amplifier circuit comprising a plurality of capacitors, a switching device, and an arithmetic amplifier circuit, at least one of the capacitors being connected to a virtual grounding terminal of the arithmetic amplifier circuit through the switching device; and
an RTZ signal receiving circuit, including a memory circuit for holding a signal encoding the RTZ signal to a digital signal, for outputting the output of the memory circuit to the D/A conversion circuit;
wherein the RTZ signal of the RTZ waveform generator circuit is constituted by a waveform including the same number of transitions from a first voltage level to a second voltage level and from the second voltage level to the first voltage level in a period when the switching device connected to the virtual grounding terminal of the arithmetic amplifier circuit keeps a state thereof unchanged.

2. An A/D conversion inte rated circuit includin a plurality of A/D converters;
each A/D converter comprising:
an input for receiving an analog signal to be A/D converted;
an output for providing at least a part of a digital signal having a predetermined number of bits representing the analog signal;
a sub-A/D conversion circuit for generating a sub-digital signal representing one or a plurality of bit values in the digital signal in response to the analog signal and feeding the sub-digital signal to the output;
an RTZ waveform generator circuit, connected to an output of the sub-A/D conversion circuit, for generating an RTZ signal having modulated the sub-digital signal;
a D/A conversion circuit;
a switched-capacitor amplifier circuit comprising a plurality of capacitors, a switching device, and an arithmetic amplifier circuit, at least one of the capacitors being connected to a virtual grounding terminal of the arithmetic amplifier circuit through the switching device; and
an RTZ signal receiving circuit, including a memory circuit for holding a signal encoding the RTZ signal to a digital signal, for outputting the output of the memory circuit to the D/A conversion circuit;
wherein the RTZ signal of the RTZ waveform generator circuit is constituted by a waveform including the same number of transitions from a first voltage level to a second voltage level and from the second voltage level to the first voltage level in a period when the virtual grounding terminal of the arithmetic amplifier circuit is in a virtual grounding state.

3. An A/D conversion inte rated circuit includin a plurality of A/D converters;
each A/D converter comprising;
an input for receiving an analog signal to be A/D converted;
an output for providing at least a part of a digital signal having a predetermined number of bits representing the analog signal;
a sub-A/D conversion circuit for generating a sub-digital signal representing one or a plurality of bit values in the digital signal in response to the analogy signal and feeding the sub-digital signal to the output;
an RTZ waveform generator circuit, connected to an output of the sub-A/D conversion circuit, for generating an RTZ signal having modulated the sub-digital signal;
a D/A conversion circuit;
a switched-capacitor amplifier circuit comprising a plurality of capacitors, a switching device, and an arithmetic amplifier circuit, at least one of the capacitors being connected to a virtual grounding terminal of the arithmetic amplifier circuit through the switching device; and
an RTZ signal receiving circuit, including a memory circuit for holding a signal encoding the RTZ signal to a digital signal, for outputting the output of the memory circuit to the D/A conversion circuit;
wherein, in a cyclic A/D conversion operation constituted by a cyclic operation mode for returning the output of the sub-A/D conversion circuit to the D/A conversion circuit and an arithmetic processing mode for the arithmetic amplifier circuit to perform arithmetic processing, the RTZ signal of the RTZ waveform generator circuit is constituted by a waveform including the same number of transitions from a first voltage level to a second voltage level and from the second voltage level to the first voltage level at least during a period of the cyclic operation mode.

4. An A/D conversion integrated circuit including a plurality of A/D converters;
each A/D converter comprising:
an input for receiving an analog signal to be A/D converted;
an output for providing at least a part of a digital signal having a predetermined number of bits representing the analog signal;
a sub-A/D conversion circuit for generating a signal representing one or a plurality of bit values in the digital signal in response to the analog signal and feeding thus generated signal to the output;
a control circuit, connected to an output of the sub-A/D conversion circuit, for providing a first control signal corresponding to the fed signal; and
a signal processing circuit having a D/A converter, a first capacitor, a second capacitor, and an arithmetic amplifier circuit;
wherein the D/A converter includes a memory circuit for latching the first control signal from the control circuit and a D/A conversion circuit having an output for providing an analog output value corresponding to a value stored in the memory circuit;
wherein the signal processing circuit performs at least one of signal processing and signal holding, the signal processing connecting the first capacitor between the output of the D/A conversion circuit and an input of the arithmetic amplifier circuit while connecting the second capacitor between an output of the arithmetic amplifier circuit and the input of the arithmetic amplifier circuit, the signal holding separating the first capacitor from the input of the arithmetic amplifier circuit while connecting the second capacitor between the output of the arithmetic amplifier circuit and the input of the arithmetic amplifier circuit; and
wherein the first control signal has a waveform including the same number of transitions from a first voltage level to a second voltage level and from the second voltage level to the first voltage level.

5. An A/D conversion integrated circuit including a plurality of A/D converters;
each A/D converter comprising:
an input for receiving an analog signal to be A/D converted;
an output for providing at least a part of a digital signal having a predetermined number of bits representing the analog signal;
a sub-A/D conversion circuit for generating a signal representing one or a plurality of bit values in the digital signal in response to the analog signal and feeding thus generated signal to the output;

a control circuit, connected to an output of the sub-A/D conversion circuit, for providing a first control signal corresponding to the fed signal; and a signal processing circuit having a D/A converter, a first capacitor, a second capacitor, and an arithmetic amplifier circuit;

wherein the D/A converter includes a memory circuit for latching the first control signal from the control circuit and a D/A conversion circuit having an output for providing an analog output value corresponding to a value stored in the memory circuit;

wherein the signal processing circuit performs signal processing while connecting the first capacitor between the output of the D/A conversion circuit and an input of the arithmetic amplifier circuit and the second capacitor between an output of the arithmetic amplifier circuit and the input of the arithmetic amplifier circuit; and wherein the first control signal has a waveform including the same number of transitions from a first voltage level to a second voltage level and from the second voltage level to the first voltage level in a period when the input of the arithmetic amplifier circuit connected to the first and second capacitors is in a high impedance state in terms of both direct and alternating currents.

6. The A/D conversion integrated circuit according to claim 4, wherein the first control signal propagates through a conductor connecting the memory circuit of the D/A converter and the control circuit; and wherein the conductor is capacitively coupled through a parasitic capacitor to a conductor region connected to the input of the arithmetic amplifier circuit during the signal processing.

7. The A/D conversion integrated circuit according to claim 4, wherein the control circuit provides a second control signal corresponding to the fed signal;

wherein the memory circuit latches the second control signal;

wherein the second control signal has a waveform including a transition from a third voltage level to a fourth voltage level and a transition from the fourth voltage level to the third voltage level; and wherein a duration of the second voltage level in the waveform of the first control signal differs from a duration of the fourth voltage level in the waveform of the second control signal.

8. The A/D conversion integrated circuit according to claim 7, wherein the control circuit provides a third control signal corresponding to the fed signal;

wherein the memory circuit latches the third control signal;

wherein the third control signal has a waveform including a transition from a fifth voltage level to a sixth voltage level and a transition from the sixth voltage level to the fifth voltage level;

wherein an interval of the transitions in the waveform of the third control signal differs from an interval of the transitions in the waveform of the first control signal wherein the interval of the transitions in the waveform of the third control signal differs from an interval of the transitions in the waveform of the second control signal.

9. The A/D conversion integrated circuit according to claim 7, wherein the control circuit provides a fourth control signal corresponding to the fed signal;

wherein the memory circuit latches the fourth control signal; and wherein the fourth control signal has a waveform with a fixed voltage level.

10. The A/D conversion integrated circuit according to claim 7, wherein the memory circuit includes a first latch circuit adapted to operate according to a first latch signal and a second latch circuit adapted to operate according to a second latch signal; and wherein the first latch signal has a latch timing different from that of the second latch signal.

11. The A/D conversion integrated circuit according to claim 4, further comprising a feedback path for feeding back an arithmetic value generated by the signal processing through the output of the signal processing circuit to the input of the signal processing circuit;

wherein the A/D converter performs cyclic A/D conversion.

12. The A/D conversion integrated circuit according to claim 4, wherein the signal processing circuit includes an input for receiving the analog signal and a third capacitor; and wherein the third capacitor is connected between the input of the signal processing circuit and the input of the arithmetic amplifier circuit in the signal processing.

13. The A/D conversion integrated circuit according to claim 12, wherein the signal processing circuit includes an additional memory circuit for latching a fifth control signal from the control circuit and an additional D/A conversion circuit having an output for providing an output value corresponding to a value stored in the additional memory circuit; and wherein the fifth control signal has a waveform including a transition from a seventh voltage level to an eighth voltage level and a transition from the eighth voltage level to the seventh voltage level.

14. The A/D conversion integrated circuit according to claim 4, further comprising a sensor array of a sensor circuit including a sensor device;

wherein the A/D converter is arranged in a column of the sensor array; and wherein the analog signal is provided by the sensor array.

15. The A/D conversion integrated circuit according to claim 5, wherein the first control signal propagates through a conductor connecting the memory circuit of the D/A converter and the control circuit; and wherein the conductor is capacitively coupled through a parasitic capacitor to a conductor region connected to the input of the arithmetic amplifier circuit during the signal processing.

16. The A/D conversion integrated circuit according to claim 5, wherein the control circuit provides a second control signal corresponding to the fed signal;

wherein the memory circuit latches the second control signal;

wherein the second control signal has a waveform including a transition from a third voltage level to a fourth voltage level and a transition from the fourth voltage level to the third voltage level; and wherein a duration of the second voltage level in the waveform of the first control signal differs from a duration of the fourth voltage level in the waveform of the second control signal.

17. The A/D conversion integrated circuit according to claim 16, wherein the control circuit provides a third control signal corresponding to the fed signal;

wherein the memory circuit latches the third control signal;

wherein the third control signal has a waveform including a transition from a fifth voltage level to a sixth voltage level and a transition from the sixth voltage level to the fifth voltage level;

wherein an interval of the transitions in the waveform of the third control signal differs from an interval of the transitions in the waveform of the first control signal
wherein the interval of the transitions in the waveform of the third control signal differs from an interval of the transitions in the waveform of the second control signal.

18. The A/D conversion integrated circuit according to claim 16, wherein the control circuit provides a fourth control signal corresponding to the fed signal;
wherein the memory circuit latches the fourth control signal; and
wherein the fourth control signal has a waveform with a fixed voltage level.

19. The A/D conversion integrated circuit according to claim 16, wherein the memory circuit includes a first latch circuit adapted to operate according to a first latch signal and a second latch circuit adapted to operate according to a second latch signal; and
wherein the first latch signal has a latch timing different from that of the second latch signal.

20. The A/D conversion integrated circuit according to claim 5, further comprising a feedback path for feeding back an arithmetic value generated by the signal processing through the output of the signal processing circuit to the input of the signal processing circuit;
wherein the A/D converter performs cyclic A/D conversion.

21. The A/D conversion integrated circuit according to claim 5, wherein the signal processing circuit includes an input for receiving the analog signal and a third capacitor; and
wherein the third capacitor is connected between the input of the signal processing circuit and the input of the arithmetic amplifier circuit in the signal processing.

22. The A/D conversion integrated circuit according to claim 21, wherein the signal processing circuit includes an additional memory circuit for latching a fifth control signal from the control circuit and an additional D/A conversion circuit having an output for providing an output value corresponding to a value stored in the additional memory circuit; and
wherein the fifth control signal has a waveform including a transition from a seventh voltage level to an eighth voltage level and a transition from the eighth voltage level to the seventh voltage level.

23. The A/D conversion integrated circuit according to claim 5, further comprising a sensor array of a sensor circuit including a sensor device;
wherein the A/D converter is arranged in a column of the sensor array; and
wherein the analog signal is provided by the sensor array.

* * * * *

UNITED STATES PATENT AND TRADEMARK OFFICE
CERTIFICATE OF CORRECTION

PATENT NO. : 8,610,615 B2  
APPLICATION NO. : 13/322375  
DATED : December 17, 2013  
INVENTOR(S) : Shoji Kawahito Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 94 days.

Signed and Sealed this
Twenty-second Day of September, 2015

Michelle K. Lee
*Director of the United States Patent and Trademark Office*